United States Patent
Itasaka

(10) Patent No.: US 10,985,697 B2
(45) Date of Patent: Apr. 20, 2021

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Yosuke Itasaka, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/824,190

(22) Filed: Mar. 19, 2020

(65) Prior Publication Data

US 2020/0304067 A1 Sep. 24, 2020

(30) Foreign Application Priority Data

Mar. 20, 2019 (JP) .............................. JP2019-052437

(51) Int. Cl.
*H03B 5/06* (2006.01)
*H03B 5/36* (2006.01)
*H03B 5/20* (2006.01)

(52) U.S. Cl.
CPC ................. *H03B 5/06* (2013.01); *H03B 5/20* (2013.01); *H03B 5/362* (2013.01)

(58) Field of Classification Search
CPC ....................................................... H03B 5/06
USPC ....................................................... 331/107 R
See application file for complete search history.

(56) References Cited

U.S. PATENT DOCUMENTS

| 6,320,474 B1* | 11/2001 | Kamiya | .................. | H01L 29/94 |
| | | | | 257/312 |
| 2008/0174377 A1* | 7/2008 | Makuta | .................. | H03B 5/362 |
| | | | | 331/116 R |
| 2015/0145611 A1 | 5/2015 | Ito et al. | | |

FOREIGN PATENT DOCUMENTS

JP 2015-104074 6/2015

* cited by examiner

*Primary Examiner* — Joseph Chang
(74) *Attorney, Agent, or Firm* — Workman Nydegger

(57) ABSTRACT

Provided is a circuit device including: an oscillation circuit oscillating a vibrator, in which the oscillation circuit includes a variable capacitance circuit having a first variable capacitance element and a second variable capacitance element constituted by a first transistor and a second transistor, and a reference voltage supply circuit. The first reference voltage is supplied to a first gate of the first transistor and a capacitance control voltage is supplied to a first impurity region of the first transistor, the second reference voltage is supplied to a second gate of the second transistor and the capacitance control voltage is supplied to a second impurity region of the second transistor, and the capacitance control voltage is supplied to a first common impurity region of the first transistor and the second transistor.

12 Claims, 19 Drawing Sheets

DA1

CIRCUIT DEVICE, OSCILLATOR, ELECTRONIC APPARATUS, AND VEHICLE

The present application is based on, and claims priority from JP Application Serial Number 2019-052437, filed Mar. 20, 2019, the disclosure of which is hereby incorporated by reference herein in its entirety.

BACKGROUND

1. Technical Field

The present disclosure relates to a circuit device, an oscillator, an electronic apparatus, and a vehicle.

2. Related Art

In a circuit device that oscillates a vibrator such as a quartz crystal vibrator, a variable capacitance circuit for adjusting an oscillation frequency is provided. For example, JP-A-2015-104074 discloses an oscillation circuit provided with a plurality of MOS-type variable capacitance elements. In the oscillation circuit disclosed in JP-A-2015-104074, a plurality of control voltages are applied to terminals of a plurality of MOS-type variable capacitance elements having different threshold voltages, and reference voltages are applied to the other terminals, thereby a variable capacitance circuit capable of ensuring linearity of frequency a change with respect to a control voltage change is realized.

In such a variable capacitance circuit, a variable capacitance element is realized using a transistor. However, due to a parasitic capacitance of the transistor, there is a problem in that a frequency variable sensitivity decreases when a load capacitance of the oscillation circuit increases.

SUMMARY

An aspect of the present disclosure relates to a circuit device including: an oscillation circuit oscillating a vibrator, in which the oscillation circuit includes a variable capacitance circuit having a first variable capacitance element constituted by a first transistor and a second variable capacitance element constituted by a second transistor, and adjusting a load capacitance of the oscillation circuit, and a reference voltage supply circuit supplying a first reference voltage and a second reference voltage to the variable capacitance circuit, the first reference voltage is supplied to a first gate that is a gate of the first transistor and a capacitance control voltage is supplied to a first impurity region that is one impurity region of the first transistor, the second reference voltage is supplied to a second gate that is a gate of the second transistor and the capacitance control voltage is supplied to a second impurity region that is one impurity region of the second transistor, and the capacitance control voltage is supplied to a first common impurity region which is a region formed of the other impurity regions of the first transistor and the second transistor.

DESCRIPTION OF EXEMPLARY EMBODIMENTS

Hereinafter, the present embodiment will be described. Note that the present embodiment to be described below does not unduly limit the contents of the disclosure described in the appended claims. In addition, all configurations to be described in the present embodiment are not limited to being essential constituent conditions.

1. Circuit Device

Figure 1:
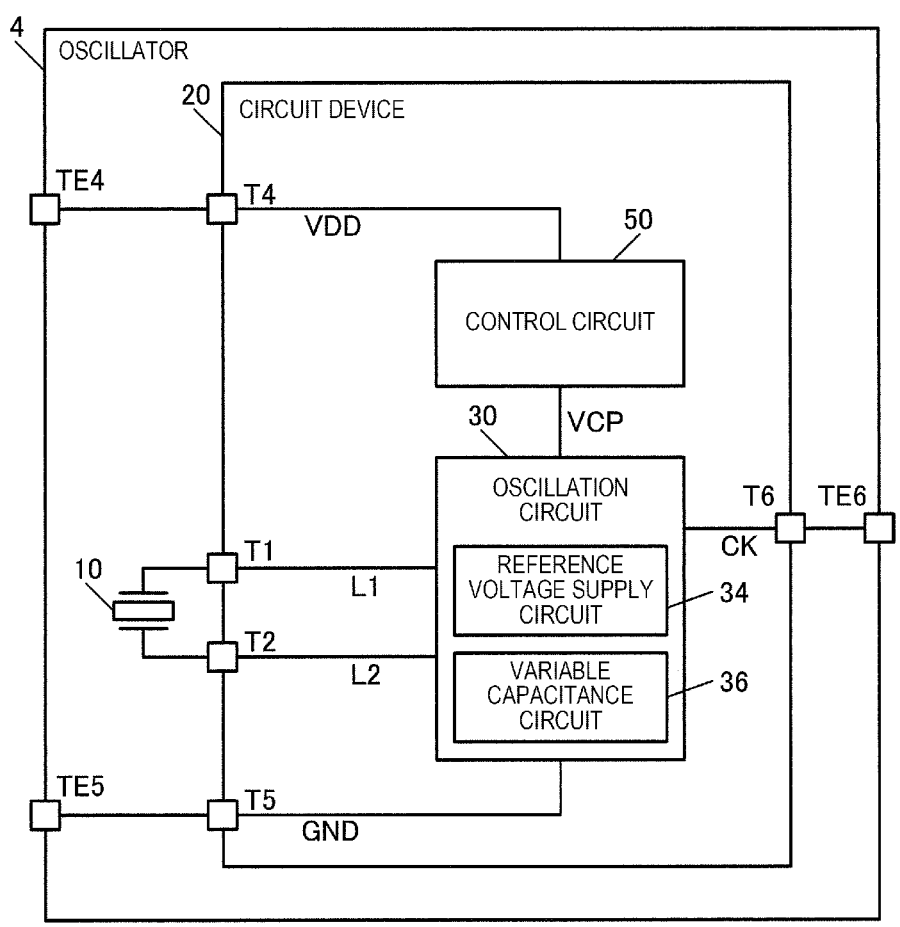
FIG. 1 shows a configuration example of a circuit device according to a present embodiment.

FIG. 1 shows a configuration example of a circuit device 20 according to a present embodiment. The circuit device 20 according to the present embodiment includes an oscillation circuit 30. Further, the oscillator 4 of the present embodiment includes a vibrator 10 and the circuit device 20. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element generating mechanical vibration by an electric signal. The vibrator 10 can be realized by a vibrator element such as a quartz crystal vibrator element, for example. For example, the vibrator 10 can be realized by a quartz crystal vibrator element in which a cut angle vibrates in a thickness-slide manner such as an AT cut or an SC cut. For example, the vibrator 10 may be a vibrator of a simple packaged crystal oscillator (SPXO). Alternatively, the vibrator 10 may be a vibrator built in a constant temperature oven controlled crystal oscillator (OCXO) having a constant temperature oven, or a vibrator built in a temperature compensated crystal oscillator (TCXO) having no constant temperature oven. Note that the vibrator 10 according to the present embodiment can be realized by various vibrator elements such as vibrator elements other than a thickness-slide vibration type or piezoelectric vibrator elements formed of materials other than quartz crystal. For example, as the vibrator 10, a surface acoustic wave (SAW) vibrator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which circuit elements are formed on a semiconductor substrate.

The circuit device 20 includes the oscillation circuit 30. The circuit device 20 may include a control circuit 50 and terminals T1, T2, T4, T5, and T6. The terminals T1, T2, T4, T5, and T6 are a first terminal, a second terminal, a fourth terminal, a fifth terminal, and a sixth terminal, respectively. Terminals T1, T2, T4, T5, and T6 are, for example, pads of the circuit device 20. The terminal T1 is electrically coupled to one end of the vibrator 10, and the terminal T2 is electrically coupled to the other end of the vibrator 10. For example, the terminals T1 and T2 of the circuit device 20 and the vibrator 10 are electrically coupled with each other using internal wiring, a bonding wire, a metal bump, or the like of a package that accommodates the vibrator 10 and the circuit device 20. The terminal T4 is a terminal to which a power supply voltage VDD is input, and the terminal T5 is a terminal to which a ground voltage GND is input. The GND can also be referred to as VSS, and the ground voltage is, for example, a ground potential. The terminal T6 is a terminal from which a clock signal CK generated by the circuit device 20 is output. As shown in FIG. 1, the terminals T4, T5, and T6 are electrically coupled to external terminals TE4, TE5, and TE6 for external coupling of the oscillator 4, respectively. For example, the terminals T4 to T6 and the external terminals TE4 to TE6 are electrically coupled with each other using the internal wiring, the bonding wire, the metal bump, or the like of the package. The external terminals TE4 to TE6 of the oscillator 4 are electrically coupled to an external device.

The oscillation circuit 30 is a circuit that oscillates the vibrator 10. For example, the oscillation circuit 30 is electrically coupled to the terminal T1 and the terminal T2, and causes the vibrator 10 to oscillate. Specifically, the oscillation circuit 30 is coupled to the terminal T1 via a wiring L1, and is coupled to the terminal T2 via a wiring L2. The wiring L1 is a first wiring, and the wiring L2 is a second wiring. For example, the oscillation circuit 30 includes an oscillation drive circuit provided between the terminal T1 and the terminal T2 that are vibrator coupling terminals. For example, the oscillation circuit 30 can be realized by a transistor such as a bipolar transistor that realizes a drive circuit, and realized by an active element such as a capacitor or a resistor. As the oscillation circuit 30, various types of oscillation circuits can be used such as a Pierce type, a Colpitts type, an inverter type, or a Hartley type. The coupling in the present embodiment is an electrical coupling. The electrical coupling is a coupling to which an electrical signal is transmittable, and a coupling that enables transmission of information by an electrical signal. The electrical coupling may be a coupling via an active element or the like.

The control circuit 50 performs various control processing. For example, the control circuit 50 controls the entire circuit device 20. For example, an operation sequence of the circuit device 20 is controlled. The control circuit 50 performs various processing for controlling the oscillation circuit 30. For example, the control circuit 50 outputs a capacitance control voltage VCP for controlling the capacity of a variable capacitance circuit 36 with respect to the oscillation circuit 30.

Here, the capacitance control voltage VCP is a voltage for a temperature compensation for the oscillation frequency of the oscillation circuit 30. For example, the control circuit 50 performs temperature compensation processing, generates a capacitance control voltage VCP based on the result of the temperature compensation processing, and outputs the capacitance control voltage VCP to the variable capacitance circuit 36 of the oscillation circuit 30. Thereby, the temperature compensation using the variable capacitance circuit 36 can be realized. Specifically, the control circuit 50 performs function generation processing for compensating the frequency-temperature characteristics of the vibrator 10 by using the polynomial approximation. For example, the control circuit 50 generates a zeroth-order component signal, a first-order component signal, a second-order component signal, a third-order component signal, and a high-order component signal that approximate a zeroth-order component, a first-order component, a second-order component, a third-order component, and a high-order component of the frequency-temperature characteristics of the vibrator 10 based on the coefficient information for the zeroth-order component, first-order component, second-order component, third-order component, and high-order component read from the non-volatile memory (not shown). The control circuit 50 performs adding processing of these zeroth-order component signal, first-order component signal, second-order component signal, third-order component signal, and high-order component signal, so that the capacitance control voltage VCP for compensating the frequency-temperature characteristics of the vibrator 10 is generated. The capacity of the variable capacitance circuit 36 of the oscillation circuit 30 is controlled based on the capacitance control voltage VCP, so that the temperature compensation processing of the frequency of the clock signal CK is realized. As a signal generated by the control circuit 50, for example, a second-order component signal or a fourth-order component signal may be omitted.

Note that the oscillator 4 may be an SPXO that does not perform the temperature compensation processing. In this case, the capacitance control voltage VCP is used for a capacitance control of the variable capacitance circuit 36 for setting the oscillation frequency of the vibrator 10 to a nominal frequency. For example, the frequency of the clock signal CK is measured at the time of manufacture or shipment, and the capacity of the variable capacitance circuit 36 is set based on the frequency measurement result. For example, a capacitance adjustment value obtained by the measurement is written in the non-volatile memory. During an actual operation of the oscillator 4, the control circuit 50 reads the capacitance control value from the non-volatile memory, and sets the capacitance control voltage VCP based on the read capacitance control value.

The oscillation circuit 30 includes a variable capacitance circuit 36 and a reference voltage supply circuit 34. The oscillation circuit 30 can include a drive circuit that drives and oscillates the vibrator 10 as will be described later.

As will be described later, the variable capacitance circuit 36 includes a first variable capacitance element constituted by a first transistor and a second variable capacitance element constituted by a second transistor. The variable capacitance circuit 36 adjusts a load capacitance of the oscillation circuit 30. The load capacitance can include, for example, a capacity of the variable capacitance circuit 36 and a parasitic capacitance of the wirings L1 and L2. The oscillation circuit 30 adjusts the load capacitance by controlling the capacity of the variable capacitance circuit 36.

The reference voltage supply circuit 34 generates a reference voltage and supplies the reference voltage to the variable capacitance circuit 36 and the like. For example, the reference voltage supply circuit 34 supplies the first reference voltage and the second reference voltage to the variable capacitance circuit 36. When the variable capacitance circuit 36 includes a third variable capacitance element constituted by a third transistor, the reference voltage supply circuit 34 supplies a third reference voltage to the variable capacitance circuit 36. That is, a plurality of reference voltages including the first reference voltage, the second reference voltage, and the third reference voltage are generated and supplied to the variable capacitance circuit 36. The reference voltage supply circuit 34 has, for example, a plurality of resistors provided in series between the power supply node and the GND node, and generates and outputs a divided voltage by the plurality of resistors as a plurality of reference voltages. In this case, the power supply node may be a regulated voltage VREG in FIG. 2 which will be described later.

Figure 2:
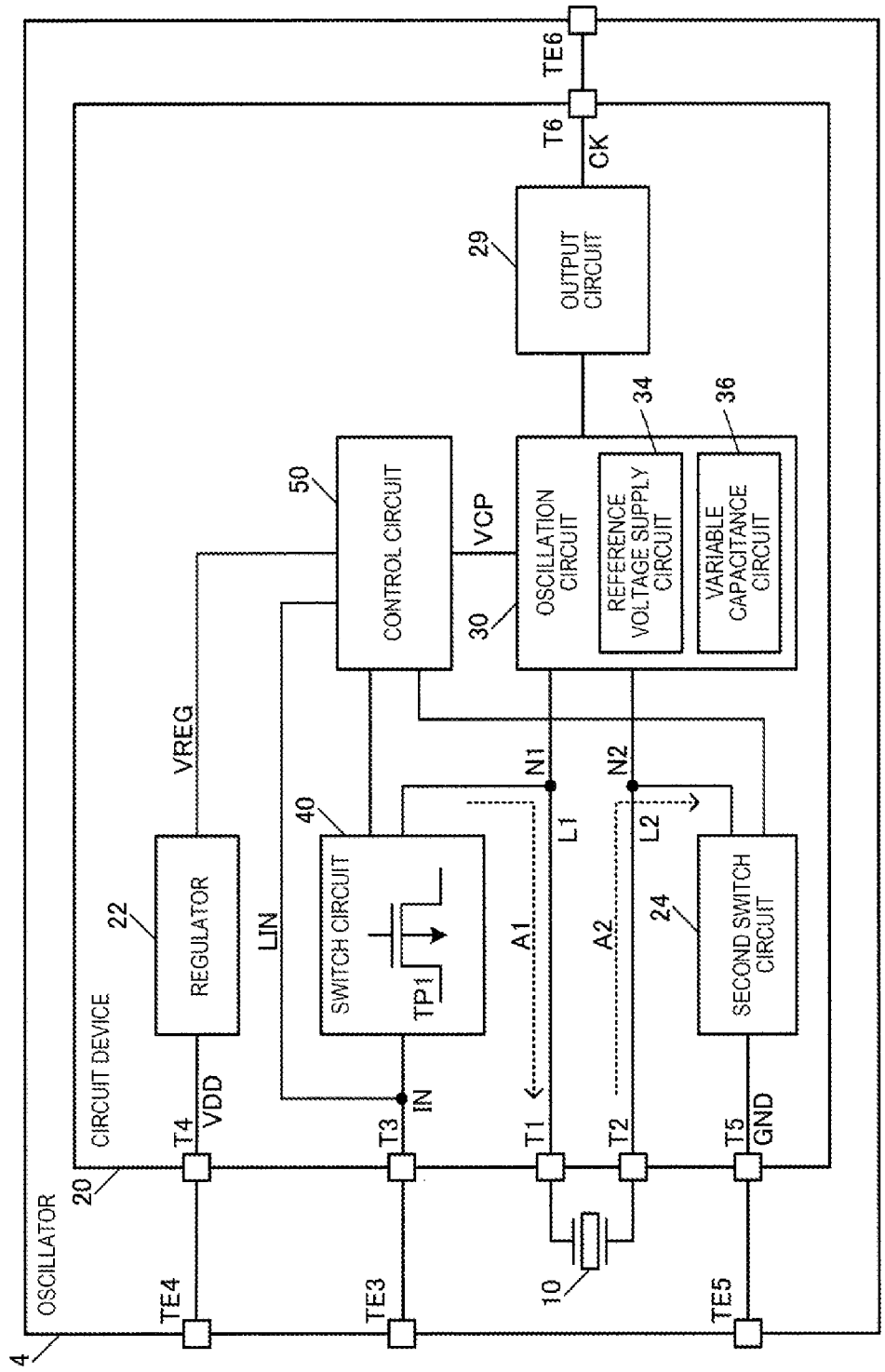
FIG. 2 shows a detailed configuration example of the circuit device according to the present embodiment.

FIG. 2 shows a detailed configuration example of the circuit device 20. In FIG. 2, in addition to the configuration in FIG. 1, a switch circuit 40, a second switch circuit 24, an output circuit 29, and a terminal T3 are further provided.

The regulator 22 performs a regulation operation based on the power supply voltage VDD from the terminal T4, and generates a regulated voltage VREG. The oscillation circuit 30 operates using, for example, a regulated voltage VREG as a power supply voltage.

The terminal T3 is a terminal to which an external input signal IN is input. The terminal T3 is a third terminal. The terminal T3 is, for example, a pad of the circuit device 20, and is electrically coupled to the external terminal TE3 of the oscillator 4. For example, the terminal T3 is a terminal to which the external input signal IN can be input, and the external input signal IN is input in a first mode or a second mode. The first mode is, for example, a normal operation mode, and the second mode is, for example, a test mode. The test mode can also be called an inspection mode.

The switch circuit 40 is provided between the wiring L1, which couples the terminal T1 and the oscillation circuit 30, and the terminal T3. The switch circuit 40 has a P-type transistor TP3. For example, one end of the switch circuit 40 is coupled to the wiring L1. For example, it is coupled to a node N1 which is a coupling node with the wiring L1. The other end of the switch circuit 40 is coupled to the terminal T3. The switch circuit 40 is controlled to be turned on and off by the control circuit 50. For example, when the switch circuit 40 is turned on, the terminal T3 and the terminal T1 are electrically coupled with each other. Thereby, the external input signal IN can be input to the one end of the vibrator 10.

For example, in the normal operation mode, a frequency control signal, an output enable signal, or a standby signal is input as the external input signal IN via the terminal T3. At this time, the switch circuit 40 is already turned off. The external input signal IN that is a frequency control signal, an output enable signal, or a standby signal is input to the control circuit 50 via a signal input wiring LIN. The control circuit 50 performs frequency control, output enable control, or standby control processing based on the frequency control signal, output enable signal, or standby signal input via the wiring LIN.

On the other hand, in the test mode, a test mode signal such as an overdrive signal is input as the external input signal IN via the terminal T3. Further, the test mode signal is input to the one end of the vibrator 10 via the switch circuit 40 that is turned on. The test mode is a mode for performing various tests and inspections such as removing foreign matter from the vibrator 10 by overdrive and inspecting drive level dependence (DLD) characteristics. The DLD characteristic is a characteristic indicating a relationship between an excitation level and an oscillation frequency of the vibrator 10. During an actual operation in which the oscillator 4 operates as a product, the circuit device 20 is set to the first mode. When a test or inspection for overdrive or DLD is performed on the oscillator 4, the circuit device 20 is set to the second mode.

The control circuit 50 outputs the regulated voltage VREG as the substrate voltage of the P-type transistor TP1 of the switch circuit 40 in the normal operation mode. Accordingly, the fluctuation of the power supply voltage VDD is transmitted to the wiring L2 via a junction capacitance of the transistor TP1 and the situation where the oscillation frequency fluctuates can be prevented. On the other hand, in the test mode, the control circuit 50 outputs the power supply voltage VDD as the substrate voltage of the transistor TP1.

The second switch circuit 24 is provided between the wiring L2, which couples the terminal T2 and the oscillation circuit 30, and the terminal T5. For example, one end of the second switch circuit 24 is coupled to the wiring L2. For example, it is coupled to a node N2 which is a coupling node with the wiring L2. The other end of the second switch circuit 24 is coupled to the terminal T5. The second switch circuit 24 is turned on when the switch circuit 40 is turned on. For example, the second switch circuit 24 is controlled to be turned on and off by the control circuit 50 in the same manner as the switch circuit 40 that is the first switch circuit. Further, when the switch circuit 40 is turned on, the second switch circuit 24 is also turned on to electrically couple the terminal T2 and the terminal T5. Thereby, the other end of the vibrator 10 can be set to GND, and an overdrive test of the vibrator 10 or the like can be performed with the paths indicated by A1 and A2 in FIG. 2. In the present embodiment, the case where two switch circuits such as the switch circuit 40 and the second switch circuit 24 are provided has been described. However, the present disclosure is not limited to this. For example, in the case of a circuit configuration in which one end of the vibrator 10 is coupled to the GND node with each other, by providing the switch circuit 40 on the other end side of the vibrator 10, it is possible to perform an inspection such as overdrive by using one switch circuit 40.

The output circuit 29 outputs the clock signal CK to the outside in various signal formats. For example, the output circuit 29 outputs the clock signal CK to the outside in a signal format such as a low voltage differential signaling (LVDS), a positive emitter coupled logic (PECL), an high speed current steering logic (HCSL), or a differential complementary MOS (CMOS). For example, the output circuit 29 may be a circuit that can output the clock signal CK in at least two signal formats of LVDS, PECL, HCSL, and differential CMOS. In this case, the output circuit 29 outputs the clock signal CK in the signal format set by the control circuit 50. The signal format of the clock signal CK output from the output circuit 29 is not limited to a differential signal format, and may be a non-differential signal format such as a single-ended CMOS or a clipped sine wave, for example.

2. Variable Capacitance Circuit

Figure 3:
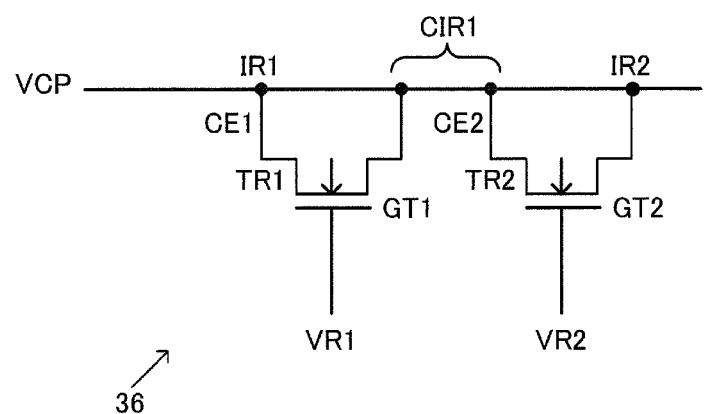
FIG. 3 shows a configuration example of a variable capacitance circuit according to the present embodiment.

FIG. 3 shows a configuration example of the variable capacitance circuit 36. The variable capacitance circuit 36 includes a variable capacitance element CE1 constituted by a transistor TR1 and a variable capacitance element CE2 constituted by a transistor TR2. The transistor TR1 is a first transistor, and the transistor TR2 is a second transistor. The variable capacitance element CE1 is a first variable capacitance element, and the variable capacitance element CE2 is a second variable capacitance element. The variable capacitance elements CE1 and CE2 are metal oxide semiconductor (MOS) type variable capacitance elements constituted by MOS transistors TR1 and TR2, and are also called MOS varactors. In FIG. 3, the variable capacitance elements CE1 and CE2 are constituted by N-type transistors. The MOS-type variable capacitance element is a capacitance element in which a source and a drain of a MOS transistor are short-circuited, and a static capacitance generated between the short-circuited source and drain, and the gate is variably controlled by the capacitance control voltage. In the following, the case where the variable capacitance circuit 36 includes two variable capacitance elements CE1 and CE2 will be mainly described as an example, but the variable capacitance circuit 36 may include three or more variable capacitance elements.

Further, as will be described later, the transistor constituting the variable capacitance element may be a P-type transistor.

Figure 6:
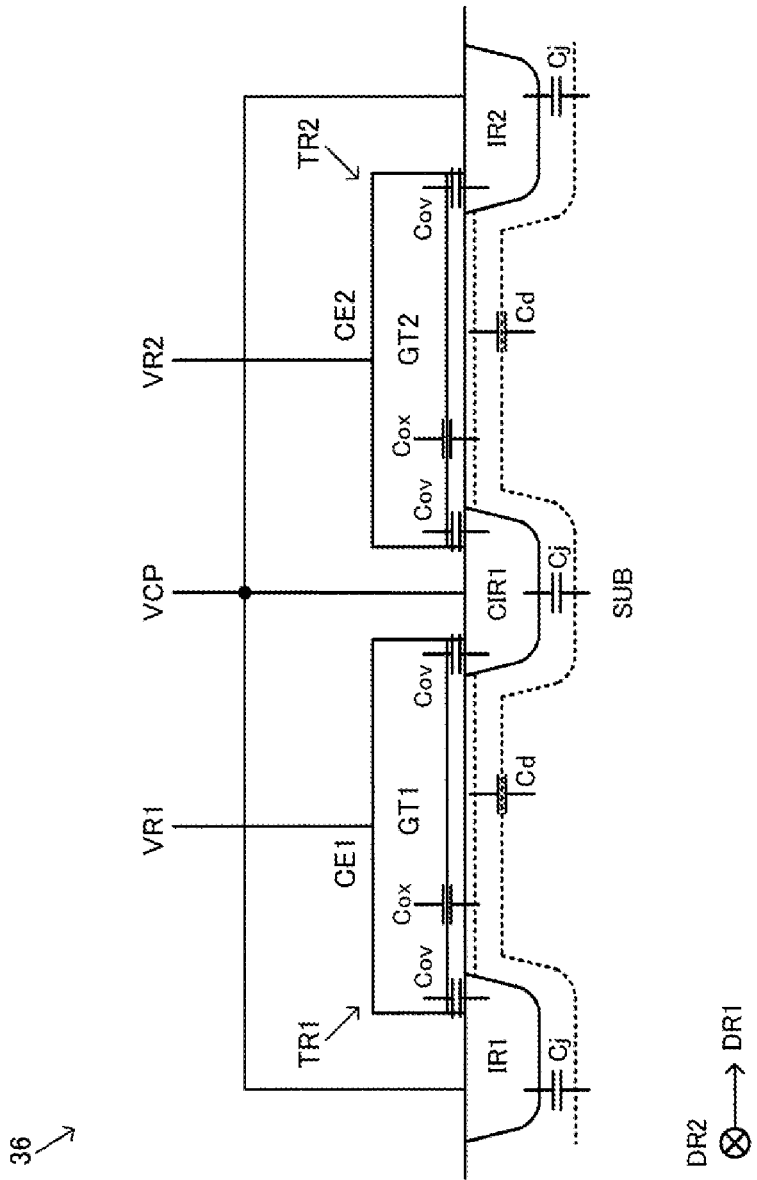
FIG. 6 shows a configuration example of a transistor of the variable capacitance circuit according to the present embodiment.

As shown in FIG. 3 and FIG. 6 described later, in the present embodiment, a reference voltage VR1 is supplied to a gate GT1 of the transistor TR1 constituting the variable capacitance element CE1 of the variable capacitance circuit 36. The capacitance control voltage VCP is supplied to an impurity region IR1 that is one impurity region of the transistor TR1. For example, the control circuit 50 shown in FIGS. 1 and 2 supplies the capacitance control voltage VCP to the variable capacitance circuit 36. The gate GT1 is a first gate, the reference voltage VR1 is a first reference voltage, and the impurity region IR1 is a first impurity region.

In the present embodiment, a reference voltage VR2 is supplied to a gate GT2 of the transistor TR2 constituting the variable capacitance element CE2 of the variable capacitance circuit 36. The capacitance control voltage VCP is supplied to an impurity region IR2 that is one impurity region of the transistor TR2. The gate GT2 is a second gate, the reference voltage VR2 is a second reference voltage, and the impurity region IR2 is a second impurity region. When temperature compensation processing is performed, the capacitance control voltage VCP is a control voltage for temperature compensation. The reference voltage VR1 and the reference voltage VR2 are different from each other.

In the present embodiment, as will be described in detail later with reference to FIG. 6, the capacitance control voltage VCP is supplied to a common impurity region CIR1 which is the other impurity regions of the transistor TR1 and the transistor TR2. One impurity region of each transistor of the transistors TR1 and TR2 is one of the drain region and the source region of each transistor, and the other impurity region is the other of the drain region and the source region of each transistor. Further, the common impurity region CIR1 means that the other impurity region that is the drain region or the source region of the transistor TR1, and the other impurity region that is the drain region or the source region of the transistor TR2 are shared without being separated by a semiconductor substrate. Note that the impurity region can also be referred to as an active region, and is a diffusion region in a narrow sense.

Figure 4:
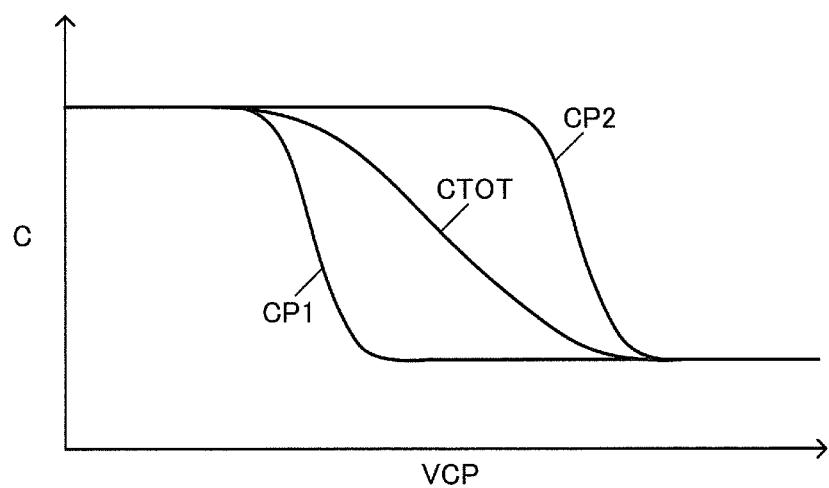
FIG. 4 shows an example of voltage capacitance characteristics of the variable capacitance circuit.

FIG. 4 is a diagram showing the voltage capacitance characteristics of the variable capacitance circuit 36. The voltage capacitance characteristic is a characteristic indicating a change in the capacity C with respect to a change in the capacitance control voltage VCP. FIG. 4 shows the voltage capacitance characteristics of the capacity CP1 of the variable capacitance element CE1, the voltage capacitance characteristics of the capacity CP2 of the variable capacitance element CE2, and the voltage capacitance characteristics of the total capacity CTOT of the variable capacitance elements CE1 and CE2. A first application voltage that becomes VCP-VR1 is applied to the variable capacitance element CE1, a second application voltage that becomes VCP-VR2 is applied to the variable capacitance element CE2, and the first application voltage and the second application voltage are different from each other. For example, VCP-VR1>VCP-VR2. Therefore, the voltage capacitance characteristics of the capacity CP1 of the variable capacitance element CE1 and the voltage capacitance characteristics of the capacity CP2 of the variable capacitance element CE2 are different from each other. By superimposing these two different characteristics, as shown in FIG. 4, the linearity characteristics of the total capacity CTOT can be improved, and the linearity of the capacitance change can be secured in a wide voltage range.

An oscillation frequency fL when the load capacitance of the oscillation circuit 30 is CL, can be expressed as the following equation (1).

$$fL = fS \cdot \left(1 + \frac{C1}{2(C0 + CL)}\right) \quad (1)$$

C0 is a parallel capacity in an equivalent circuit of the vibrator 10, and C1 is a series capacity. "fs" is a set frequency that becomes a reference. The capacitance ratio of the vibrator 10 can be expressed as γ=C0/C1. In order to increase the frequency variable sensitivity representing the frequency change with respect to the change in the load capacity CL, it is necessary to reduce the capacitance ratio γ. However, there is a limit to reducing the capacitance ratio γ of the vibrator 10.

Figure 5:
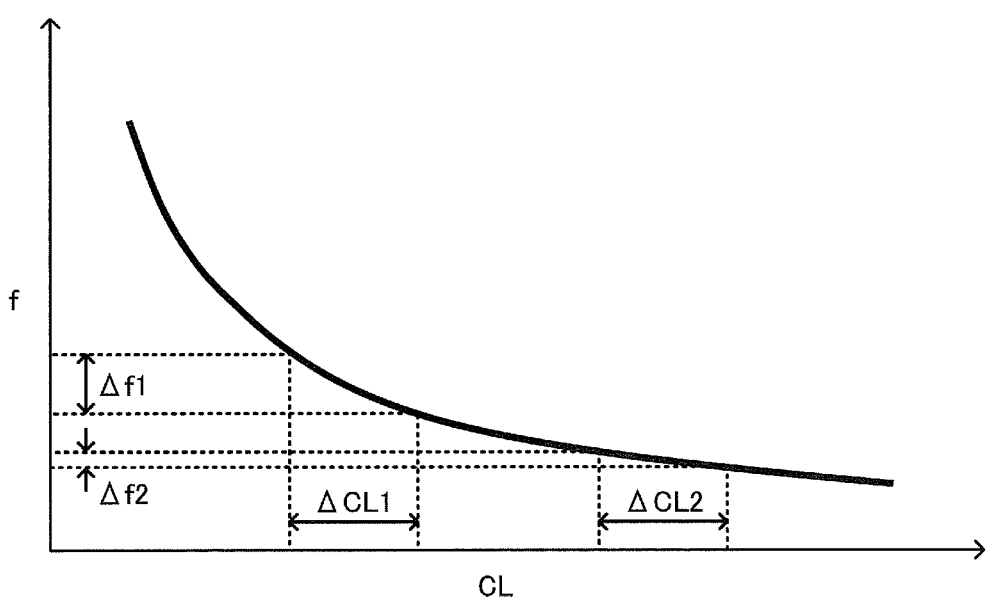
FIG. 5 is an explanatory diagram of a change in frequency variable sensitivity according to the magnitude of a load capacitance.

On the other hand, as shown in FIG. 5, when a load capacitance CL is small, the change in the frequency f when the load capacitance CL is changed by ΔCL1 becomes Δf1, and the frequency variable sensitivity representing the frequency change with respect to the change in the load capacitance CL can be increased. However, when the load capacitance CL is large, the change in the frequency f when the load capacity CL is changed by ΔCL2=ΔCL1 becomes Δf2<Δf1, and the frequency variable sensitivity becomes small as compared with the case where the load capacitance CL is small. In other words, when the load capacitance CL is large, the variable capacitance circuit 36 needs to greatly change the load capacitance CL in order to greatly change the frequency f as in the case where the load capacitance CL is small. That is, in FIG. 5, in order to satisfy Δf2=Δf1, the variable capacitance circuit 36 needs to greatly change the load capacitance CL so that it satisfies ΔCL2>ΔCL1. However, when the variable capacitance circuit 36 is used to greatly change the load capacitance CL, the circuit area of the variable capacitance circuit 36 increases, which hinders miniaturizing of the circuit device 20.

Further, by providing a plurality of variable capacitance elements to which different reference voltages are supplied to the gate as shown in FIG. 3, the linearity characteristics can be improved as shown in FIG. 4, and the linearity of capacitance change is ensured in a wide voltage range. However, when there is no contrivance for the arrangement of the multiple transistors constituting a plurality of variable capacitance elements, there is a problem that the circuit size increases and it is difficult to realize a miniaturization in the size of the circuit device 20 due to the increase in the number of transistors arranged as variable capacitance elements.

Therefore, in the variable capacitance circuit 36 according to the present embodiment, the reference voltages VR1 and VR2 that are different from each other, are supplied to the gates GT1 and GT2 of the transistors TR1 and TR2 constituting the variable capacitance elements CE1 and CE2. Further, the capacitance control voltage VCP is supplied to the impurity regions IR1 and IR2 that are impurity regions of the transistors TR1 and TR2, and the capacitance control voltage VCP is supplied to the common impurity region CIR1 that is the other impurity regions of the transistors TR1 and TR2.

FIG. 6 shows a configuration example of the transistors TR1 and TR2 of the variable capacitance circuit 36 according to the present embodiment. FIG. 6 is a cross-sectional diagram of the transistors TR1 and TR2 constituting the variable capacitance elements CE1 and CE2 that are MOS capacitors. The transistors TR1 and TR2 are formed on a semiconductor substrate (SUB) of the circuit device 20. As shown in FIG. 6, the reference voltage VR1 is supplied to the gate GT1 of the transistor TR1, and the reference voltage VR2 is supplied to the gate GT2 of the transistor TR2. That is, a different reference voltage is supplied to each gate. The capacitance control voltage VCP is supplied to the impurity region IR1 of the transistor TR1 and the impurity region IR2 of the transistor TR2. The impurity regions IR1 and IR2 are one of the drain region and the source region of the transistors TR1 and TR2. In the present embodiment, the capacitance control voltage VCP is supplied to the common impurity region CIR1 that becomes the other impurity regions of the transistors TR1 and TR2. The common impurity region CIR1 is the other of the drain region and the source region of the transistors TR1 and TR2. As an example, the impurity regions IR1 and IR2 are the drain regions, the common impurity region CIR1 is the source region, and in the transistors TR1 and TR2, the source region is shared as the common impurity region CIR1. When a direction from the gate GT1 toward the gate GT2 is DR1, the impurity region IR1, the gate GT1, the common impurity region CIR1, the gate GT2, and the impurity region IR2 are arranged along the direction DR1 in the order of IR1, GT1, CIR1, GT2, and IR2.

Note that in FIG. 6, Cox is a gate oxide film capacitance, Cd is a depletion layer capacitance, Cj is a junction capacitance between the source region or drain region and the substrate, and Coy is an overlap capacitance between the gate and the source regions or the drain region. When the gate voltage is lower than a flat band voltage, since it becomes in an accumulated state where holes are attracted to a substrate surface, the capacity of the MOS capacitor becomes the gate oxide film capacity Cox and becomes the maximum. When the gate voltage becomes higher than the flat band voltage, a depletion layer is formed on the substrate surface, and the capacity of the MOS capacitor becomes a series capacitance of the gate oxide film capacitance Cox and the depletion layer capacitance Cd. As the gate voltage increases, the depletion layer spreads, so that the depletion layer capacitance Cd decreases, and the capacity of the MOS capacitor decreases. Thereby, the voltage capacitance characteristics as shown in FIG. 4 are obtained. When the gate voltage reaches the threshold voltage, minority carriers are induced on the substrate surface to form an inversion layer that is a channel, and the depletion layer does not spread. Thereafter, since the generation and disappearance of electrons cannot respond to the high frequency signal, the capacity of the MOS capacitor becomes a constant value with respect to the high frequency signal.

Figure 7:
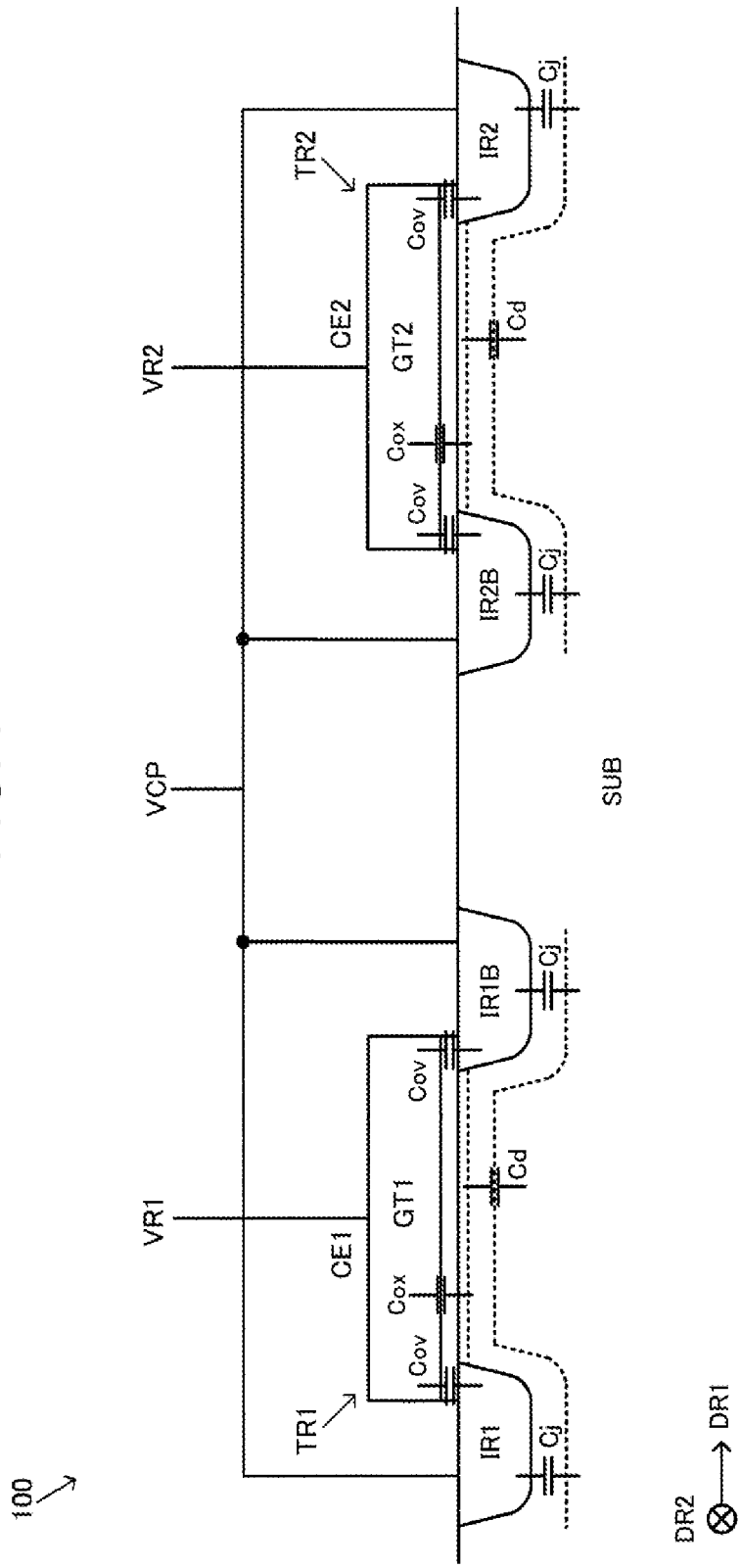
FIG. 7 shows a configuration example of the transistor of the variable capacitance circuit of a comparative example.

FIG. 7 shows a configuration example of the transistors TR1 and TR2 of a variable capacitance circuit 100 of the comparative example. In FIG. 7, as in FIG. 6, the reference voltages VR1 and VR2 are supplied to the gates GT1 and GT2 of the transistors TR1 and TR2, respectively, and the capacitance control voltage VCP is supplied to the impurity regions IR1 and IR2. However, in FIG. 7, unlike FIG. 6, the impurity regions IR1B and IR2B are not common impurity regions, and are formed separately by being separated by the substrate. Therefore, the junction capacitance Cj between the impurity regions IR1B and IR2B and the substrate is increased. Thereby, the capacity of the variable capacitance circuit 100 increases and the total load capacitance CL of the oscillation circuit 30 increases. Therefore, in FIG. 5, capacitance adjustment by the variable capacitance circuit 100 is performed in a region where the load capacitance CL is large, and it is difficult to obtain a desired frequency variable sensitivity. Further, when the capacity of the variable capacitance circuit 100 is increased so that the capacity can be varied greatly in order to obtain a desired frequency variable sensitivity, a problem such as an increase in the size of the circuit is caused.

In contrast to this, in the present embodiment, as shown in FIG. 6, the common impurity region CIR1 is shared by the transistor TR1 and the transistor TR2. Therefore, as compared with FIG. 7, the junction capacitance Cj with the substrate can be reduced, and the total load capacitance CL of the oscillation circuit 30 can be reduced. As a result, the capacitance adjustment by the variable capacitance circuit 36 is possible in the region where the load capacitance CL is small in FIG. 5. Therefore, a desired frequency variable sensitivity can be obtained without increasing the capacity of the variable capacitance circuit 36, and the oscillation frequency can be adjusted in a desired frequency range by performing an capacitance adjustment of the variable capacitance circuit 36. Therefore, for example, when a temperature compensation is performed by performing the capacitance adjustment of the variable capacitance circuit 36, appropriate temperature compensation processing can be realized. Further, since it is not necessary to increase the capacity of the variable capacitance circuit 36, the circuit can be reduced in size.

In the variable capacitance circuit 100 of the comparative example in FIG. 7, since the impurity regions IR1B and IR2B are separately provided without sharing the impurity region between the transistors TR1 and TR2, it is necessary to increase a distance between the transistors TR1 and TR2 accordingly. Therefore, an arrangement region of the transistors TR1 and TR2 becomes longer in the direction DR1 in FIG. 7, and the variable capacitance circuit 100 becomes larger. Therefore, it becomes difficult to reduce the size of the circuit device 20.

In contrast to this, according to the variable capacitance circuit 36 of the present embodiment in FIG. 6, the common impurity region CIR1 is shared by the transistor TR1 and the transistor TR2. Therefore, the distance between the transistors TR1 and TR2 can be reduced as compared with FIG. 6. As a result, the length of the arrangement region of the transistors TR1 and TR2 in the direction DR1 can be shortened, and the layout area of the variable capacitance circuit 36 is reduced, so that the miniaturization of the circuit device 20 can be realized.

Figure 8:
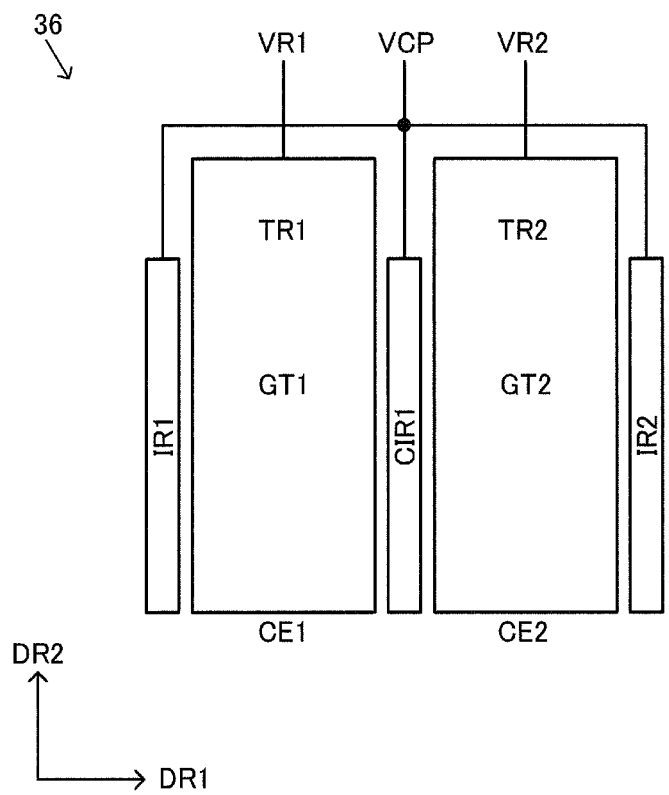
FIG. 8 shows an arrangement configuration example of the variable capacitance circuit according to the present embodiment.
Figure 9:
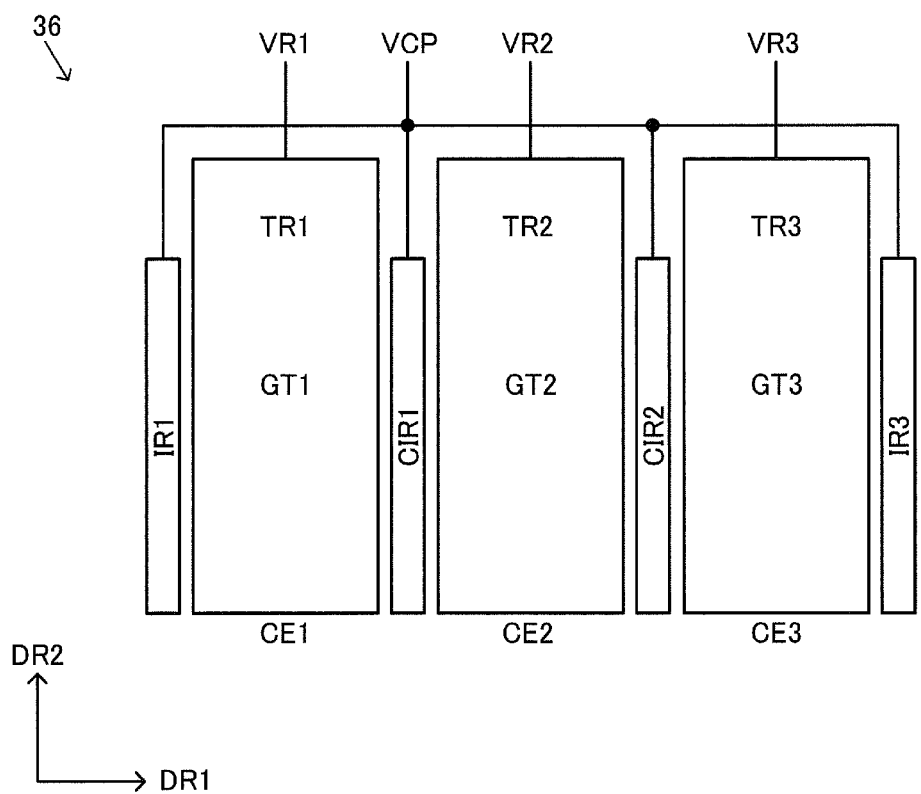
FIG. 9 shows an arrangement configuration example of the variable capacitance circuit according to the present embodiment.

FIGS. 8 and 9 show arrangement configuration examples of the variable capacitance circuit 36. FIGS. 8 and 9 are plan diagrams of the circuit device 20 as viewed in plan view in a direction orthogonal to a semiconductor substrate. In the variable capacitance circuit 36 in FIG. 8, the impurity region IR1, the gate GT1, the common impurity region CIR1, the gate GT2, and the impurity region IR2 are arranged along the direction DR1 in the order of IR1, GT1, CIR1, GT2, and IR2. The direction DR1 is a direction from the gate GT1 toward the gate GT2, for example, a short side direction of the transistors TR1 and TR2. The direction DR2 is a direction orthogonal to the direction DR1, and is, for example, a long side direction of the transistors TR1 and TR2.

Figure 10:
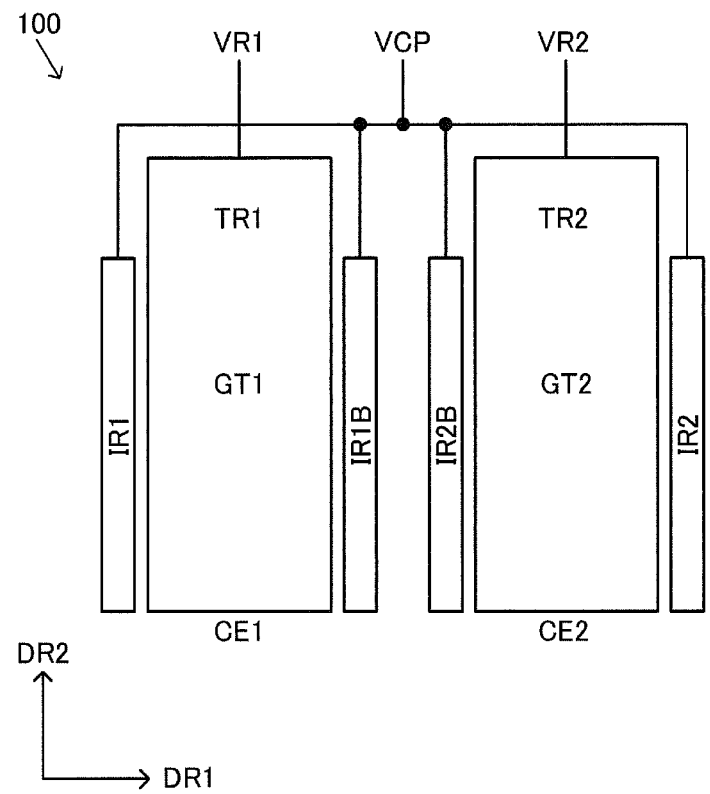
FIG. 10 shows an arrangement configuration example of the variable capacitance circuit of a comparative example.

Thus, by arranging the impurity region IR1, the gate GT1, the common impurity region CIR1, the gate GT2, and the impurity region IR2 in this order, the length of the variable capacitance circuit 36 in the direction DR1 can be shortened and the variable capacitance circuit 36 can be reduced in size. For example, FIG. 10 shows an arrangement configuration example of the variable capacitance circuit 100 of the comparative example. In this variable capacitance circuit 100, the impurity regions IR1B and IR2B are not shared and are arranged separately, so that the length of the variable capacitance circuit 100 in the direction DR1 becomes long. In contrast to this, in FIG. 8, since the impurity regions of the transistors TR1 and TR2 are shared by the common impurity region CIR1, the length of the variable capacitance circuit 36 in the direction DR1 can be shortened, and the circuit can be reduced in size.

In FIG. 9, the variable capacitance circuit 36 includes a variable capacitance element CE3 constituted by a transistor TR3. The transistor TR3 is a third transistor, and the variable capacitance element CE3 is a third variable capacitance element. The reference voltage supply circuit 34 in FIGS. 1 and 2 supplies a reference voltage VR3 that is a third reference voltage. As shown in FIG. 9, the reference voltage VR3 is supplied to a gate GT3 of the transistor TR3, and the capacitance control voltage VCP is supplied to an impurity region IR3 that is one impurity region of the transistor TR3. The one impurity region is, for example, a source region of the transistor TR3, and the impurity region IR3 is a third impurity region. The capacitance control voltage VCP is supplied to the common impurity region CIR2 that is the other impurity regions of the transistors TR2 and TR3. The other impurity regions are, for example, the drain regions of the transistors TR2 and TR3, and the common impurity region CIR2 is a second impurity region.

Figure 11:
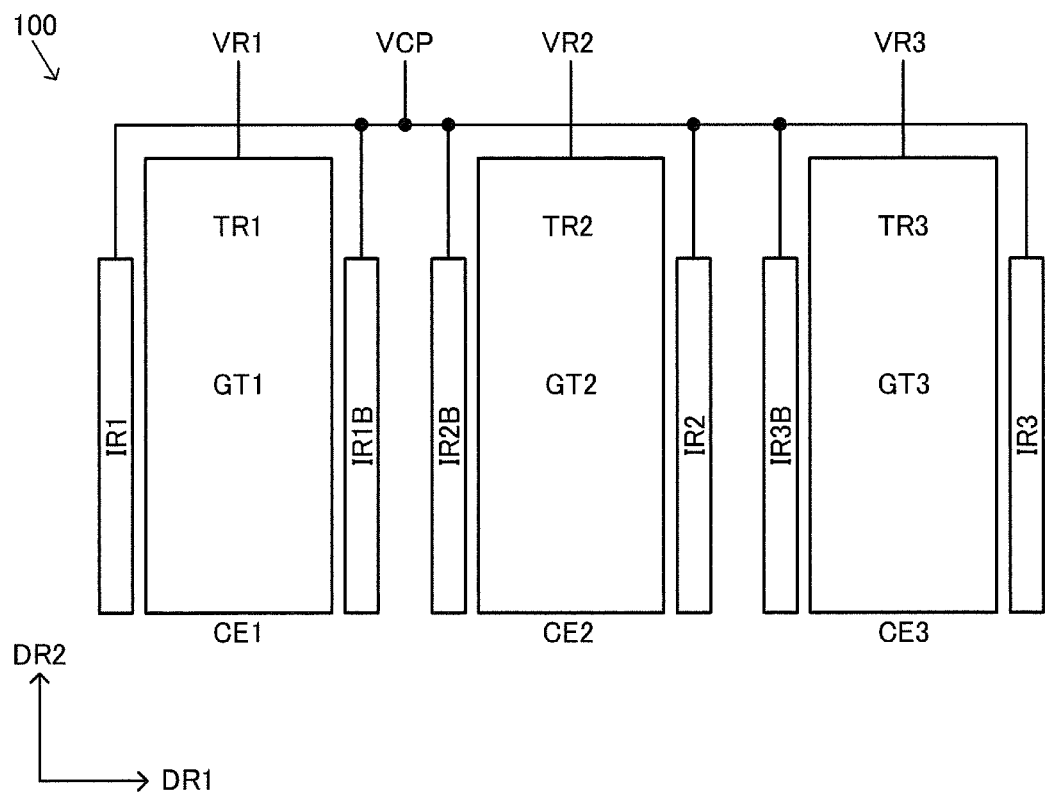
FIG. 11 shows an arrangement configuration example of the variable capacitance circuit of a comparative example.

In this way, by providing the three variable capacitance elements CE1, CE2, and CE3, the linearity characteristics in the voltage capacitance characteristics in FIG. 4 can be further improved. In the present embodiment, the common impurity region CIR2 is shared by the transistor TR2 and the transistor TR3 even when the transistor TR3 constituting the variable capacitance element CE3 is provided in this way. For example, FIG. 11 shows an arrangement configuration example of the variable capacitance circuit 100 of the comparative example. In FIG. 11, since the transistor regions TR2 and TR3 do not share the impurity regions IR2 and IR3B, the length of the variable capacitance circuit 100 in the direction DR1 becomes long, and the size reduction of the circuit cannot be realized. In contrast to this, in the present embodiment shown in FIG. 9, since the common impurity region CIR2 is shared by the transistors TR2 and TR3, the length of the variable capacitance circuit 36 in the direction DR1 can be shortened, and the circuit can be reduced in size. In FIG. 11, since the impurity regions IR2 and IR3B are separately provided, the junction capacitance between these impurity regions IR2 and IR3B and the substrate is increased. Therefore, in FIG. 5, the capacity must be changed by the variable capacitance circuit 100 in a region where the load capacitance CL is large, and it is difficult to obtain a desired frequency variable sensitivity. In contrast to this, in FIG. 9, since the common impurity region CIR2 is shared by the transistors TR2 and TR3, the junction capacitance with the substrate can be reduced. Therefore, in FIG. 5, the capacity can be changed by the variable capacitance circuit 36 in a region where the load capacitance CL is small, and a desired frequency variable sensitivity can be easily obtained, and the size reduction of the variable capacitance circuit 36 can be realized.

In the present embodiment, the larger the number of variable capacitance elements provided in the variable capacitance circuit 36, the more advantageous than the variable capacitance circuit 100 in FIGS. 10 and 11. For example, as the number of variable capacitance elements increases, the linearity characteristics in FIG. 4 can be improved, and the linearity of capacitance change can be ensured in a wider voltage range. However, in the variable capacitance circuit 100 in FIG. 10 and FIG. 11, as the number of variable capacitance elements increases, the junction capacitance increases, it becomes difficult to obtain a desired frequency variable sensitivity, and the circuit becomes larger due to an increase in the area of the impurity region. In this regard, according to the variable capacitance circuit 36 of the present embodiment, even when the number of variable capacitance elements is increased to improve the linearity characteristic, an increase in junction capacitance or an increase in circuit area can be suppressed as compared with the variable capacitance circuit 100 in FIGS. 10 and 11, thereby, there are advantages that the desired frequency variable sensitivity can be easily obtained and the circuit can be reduced in size.

Figure 12:
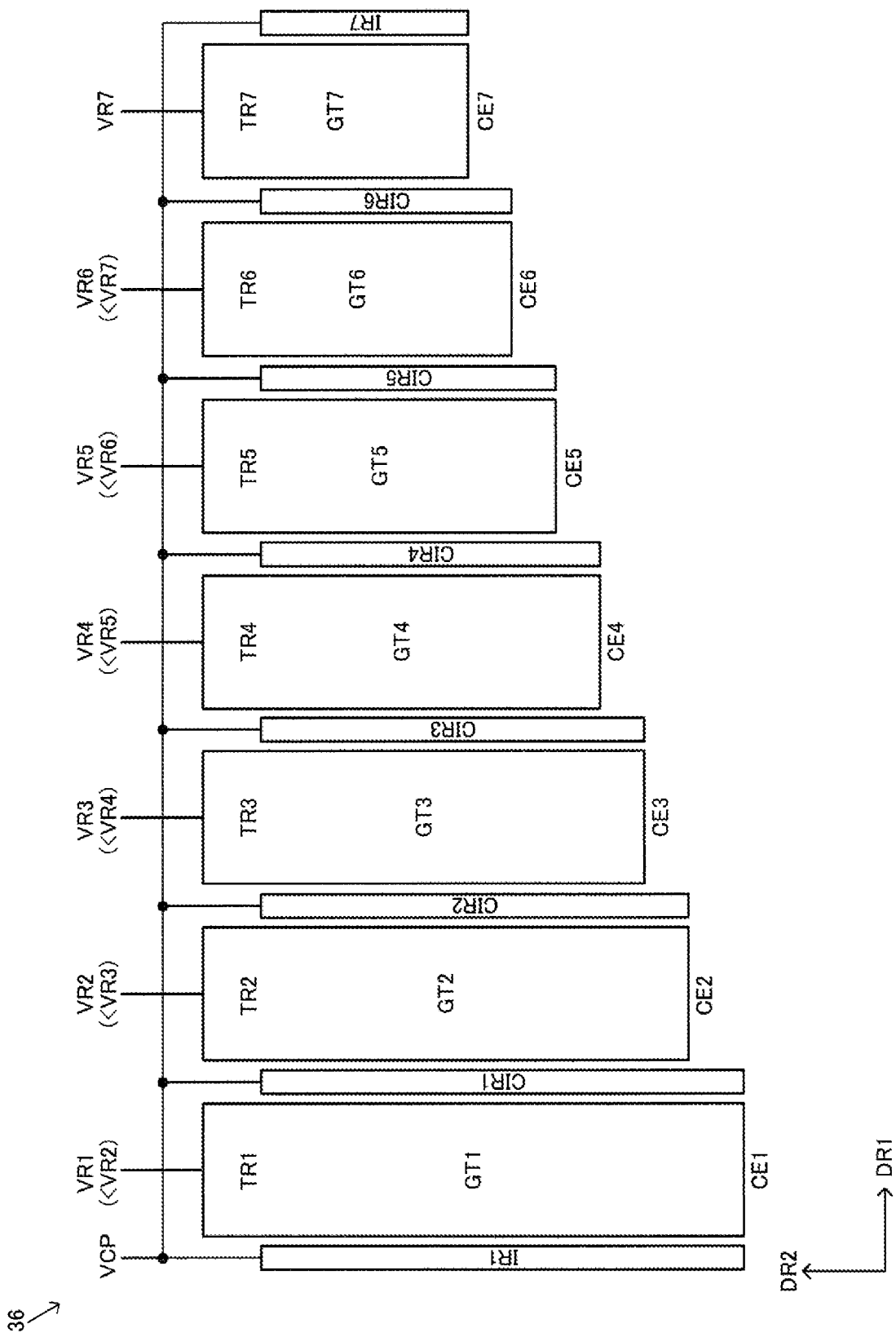
FIG. 12 shows a first arrangement configuration example of the variable capacitance circuit provided with a plurality of transistors having different channel widths.

FIG. 12 shows a first arrangement configuration example of the variable capacitance circuit 36 provided with a plurality of transistors TR1 to TR7 having different channel widths. In FIG. 12, the channel widths correspond to the lengths in the direction DR2 for the channel regions of the transistors TR1 to TR7.

In FIG. 12, variable capacitance elements CE1 to CE7 are constituted by the transistors TR1 to TR7. The reference voltages VR1, VR2, VR3, VR4, VR5, VR6, and VR7 are supplied to the gates GT1, GT2, GT3, GT4, GT5, GT6, and GT7 of the transistors TR1, TR2, TR3, TR4, TR5, TR6, and TR7. The capacitance control voltage VCP is supplied to the impurity regions IR1 and IR7, and the common impurity regions CIR1, CIR2, CIR3, CIR4, CIR5, and CIR6. CIR1 is a common impurity region for the transistors TR1 and TR2, CIR2 is a common impurity region for the transistors TR2 and TR3, and CIR3 is a common impurity region for the transistors TR3 and TR4. Each of CIR4, CIR5, and CIR6 is also a common impurity region of the corresponding two transistors.

In FIG. 12, the transistors TR1 and TR2 are the N-type transistors, and the reference voltage VR1 supplied to the gate GT1 of the transistor TR1 is smaller than the reference voltage VR2 supplied to the gate GT2 of the transistor TR2. That is, VR1<VR2. The capacity CP1 of the variable capacitance element CE1 is larger than the capacity CP2 of the variable capacitance element CE2. That is, CP1>CP2. For example, in FIG. 12, a channel width W=W1 of the transistor TR1 is larger than a channel width W=W2 of the transistor TR2, and W1>W2. The capacities CP1 and CP2 of the variable capacitance elements CE1 and CE2 are proportional to a gate area in the channel regions of the transistors TR1 and TR2, and are proportional to a gate capacitance. That is, it is proportional to the transistor size SZ=L×W. For example, when the channel length of the transistors TR1 and TR2 is L, the capacity CP1 of the variable capacitance element CE1 is proportional to L×W1, and the capacity CP2 of the variable capacitance element CE2 is proportional to L×W2. In FIG. 12, since the channel width satisfies W1>W2, the capacity satisfies CP1>CP2. As described above, in FIG. 12, VR1<VR2 is established for the reference voltage, and CP1>CP2 is established for the capacities of the variable capacitance elements CE1 and CE2.

Figure 13:
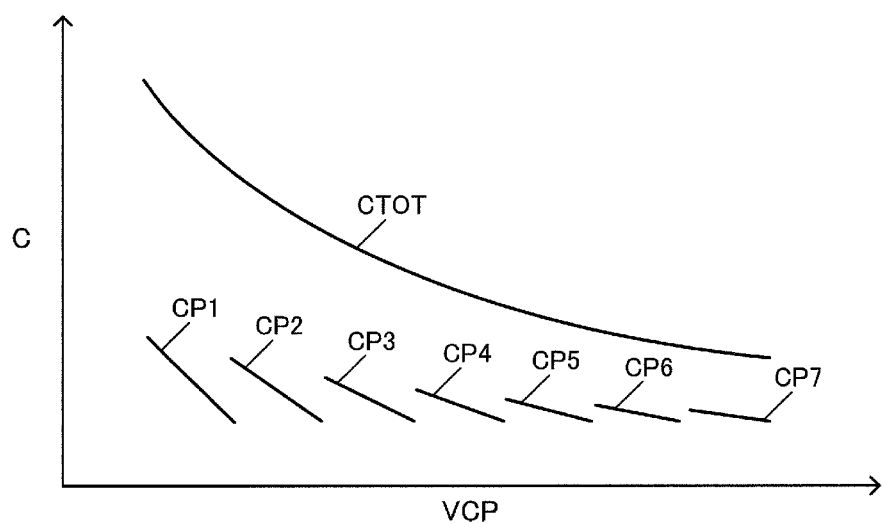
FIG. 13 shows an example of voltage capacitance characteristics of the variable capacitance circuit.

Similarly, in FIG. 12, the relationship of VR2<VR3<VR4<VR5<VR6<VR7 is established for the reference voltages supplied to the gates GT2 to GT7 of the variable capacitance elements CE2 to CE7. Since the channel widths W2 to W7 of the transistors TR2 to TR7 are represented as W2>W3>W4>W5>W6>W7, the relationship of CP2>CP3>CP4>CP5>CP6>CP7 is established for the capacitances CP2 to CP7 of the variable capacitance elements CE2 to CE7. By establishing the above relationship between the reference voltages VR1 to VR7 and the capacitances CP1 to CP7 of the variable capacitance elements CE1 to CE7, the total capacity CTOT of the variable capacitance circuit 36 has the voltage capacitance characteristics as shown in FIG. 13. Therefore, the linearity of the capacitance change of the total capacity CTOT can be ensured in the wide voltage range of the capacitance control voltage VCP.

For example, the sensitivity TS representing a change in frequency with respect to a change in load capacitance is expressed as the following equation (2). The unit of sensitivity TS is ppm/F. The sensitivity TS is also called a frequency variable sensitivity.

$$TS = \frac{df}{dCL} = -\frac{C1}{2\cdot(C0+CL)^2} \times 1e^{-6} \quad (2)$$

Further, the sensitivity of the variable capacitance circuit 36 is set to SVC as shown in the following equation (3)

$$SVC = \frac{dCL}{dVCP} \quad (3)$$

The sensitivity SVC is a sensitivity that represents a change in capacity of the variable capacitance circuit 36 with respect to a change in the capacitance control voltage VCP, and the unit of the sensitivity is pF/V. The sensitivity SVC is, for example, a negative value. When the capacitance control voltage VCP increases, the capacity decreases and the frequency decreases.

From the above equations (2) and (3), the sensitivity KV representing the change in frequency with respect to the capacitance control voltage VCP is represented by the following equation (4).

$$KV = \frac{df}{dVCP} = TS \times SVC = -\frac{SVC}{(C0+CL)^2} \times \frac{C1}{2} \times 1e^{-6} \quad (4)$$

In the above equation (4), the sensitivity KV needs to be a constant value in order to change the frequency linearly. Therefore, when the sensitivity KV is a constant value in the above equation (4), the following equation (5) is established.

$$|SVC| \propto (C0+CL)^2 \quad (5)$$

As apparent from the above equation (5), in order to change the frequency linearly, it is necessary to increase the transistor size SZ=L×W so that the |SVC| increases when the capacitance control voltage VCP is small and the load capacitance CL is large. For example, as described with reference to FIGS. 6 and 4, when the capacitance control voltage VCP is small, the capacity of the MOS capacitor, that is a variable capacitance element, increases, and the load capacitance CL increases. That is, as shown in FIG. 13, the total capacity CTOT of the variable capacitance circuit 36 increases. Further, as shown in the above equation (2) or FIG. 5, when the load capacitance CL is large, the sensitivity TS representing the change in frequency with respect to the change in the load capacity CL decreases. For example, in FIG. 5, when the load capacitance CL is large, even when the load capacitance CL changes by ΔCL2, Δf2 that is a change in frequency, becomes small. Therefore, when the load capacitance CL is large in this way, the sensitivity SVC of the variable capacitance circuit 36 of the above equation (3) is increased. In this way, even when the load capacitance CL increases and the sensitivity TS decreases, the sensitivity SVC increases, so that KV=TS×SVC is kept constant, and the linearity of the capacitance change of the total capacity CTOT can be secured.

For example, FIG. 13 shows the voltage capacitance characteristics of the capacities CP1 to CP7 of the variable capacitance elements CE1 to CE7 constituted by the transistors TR1 to TR7. The slopes in the voltage capacitance characteristics of these capacitors CP1 to CP7 correspond to the sensitivity SVC. In the present embodiment, when the capacitance control voltage VCP decreases and the load capacitance CL increases, for example, the sensitivity SVC for the variable capacitance element CE1 is increased to increase the slope of the voltage capacitance characteristic of the capacitance CP1. Specifically, the transistor size is increased by increasing the channel width or channel length of the transistor TR1 constituting the variable capacitance element CE1, and the sensitivity SVC is increased. Thereby, as shown in FIG. 13, the slope of the voltage capacitance characteristic of the capacity CP1 is increased, and the linearity of the total capacity CTOT is ensured. That is, in FIG. 13, the slope of the voltage capacitance characteristic of the capacity CP7 is the largest, and the slope of the voltage capacitance characteristic of the capacity CP1 is the smallest. By adjusting the slopes of the voltage capacitance characteristics of the capacities CP7 to CP1 in this way, the linearity of the total capacity CTOT is ensured. Such adjustment of the slopes of the voltage capacitance characteristics can be realized by adjusting the transistor sizes by adjusting the channel widths or channel lengths of the transistors TR1 to TR7 constituting the variable capacitance elements CE1 to CE7. That is, by adjusting the transistor sizes so that CP1>CP2>CP3>CP4>CP5>CP6>CP7 is established, the sensitivity adjustment, which is a slope adjustment for CP1 to CP7, is performed to ensure the linearity of the total capacity CTOT as shown in FIG. 13.

Figure 14:
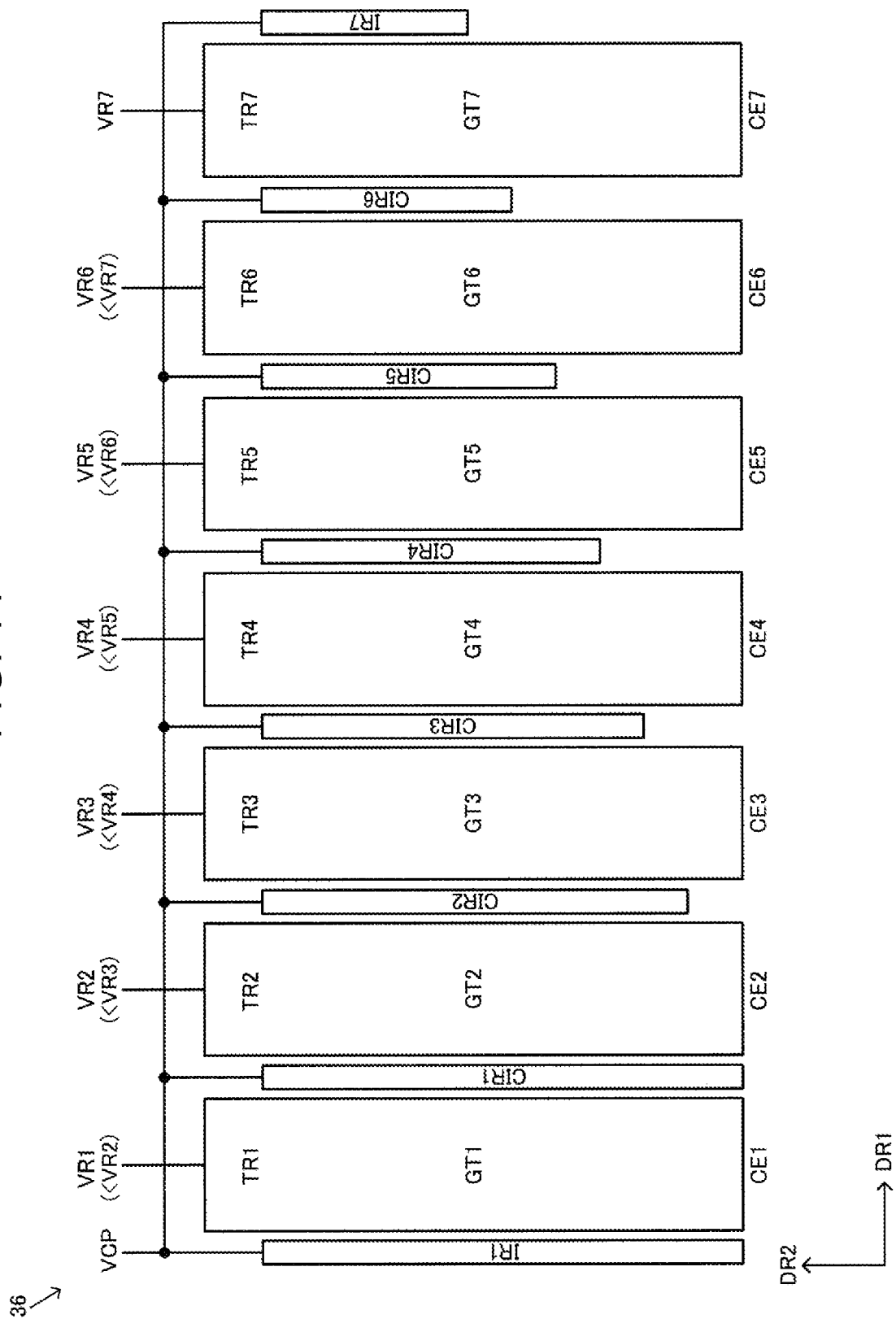
FIG. 14 shows a second arrangement configuration example of the variable capacitance circuit provided with a plurality of transistors having different channel widths.

FIG. 14 shows a second arrangement configuration example of the variable capacitance circuit 36 provided with a plurality of transistors TR1 to TR7 having different channel widths. In FIG. 14, as in FIG. 12, the relationship of W1>W2>W3>W4>W5>W6>W7 is established for the channel widths W1 to W7 of the transistors TR1 to TR7 constituting the variable capacitance elements CE1 to CE7. Therefore, the relationship of CP1>CP2>CP3>CP4>CP5>CP6>CP7 is established for the capacities of the variable capacitance elements CE1 to CE7. At this time, in FIG. 12, the relationship of GT1>GT2>GT3>GT4>GT5>GT6>GT7 is established for the lengths of the gates GT1 to GT7 in the direction DR2, but in FIG. 14, the relationship of GT1=GT2=GT3=GT4=GT5=GT6=GT7 is established since the gate lengths in the direction DR2 are the same. That is, in FIG. 14, the channel widths W1 to W7 of the transistors TR1 to TR7 are changed by changing the lengths of the impurity regions IR1, CIR1, CIR2 . . . IR7 in the direction DR2 instead of the length of the gate itself. In this way, since the gates GT1 to GT7 of the transistors TR1 to TR7 can be made to have the same shape of gate electrodes, manufacturing variations in the shapes or dimensions of the gates GT1 to GT7 can be reduced, and a more accurate capacitance value can be set.

Figure 15:
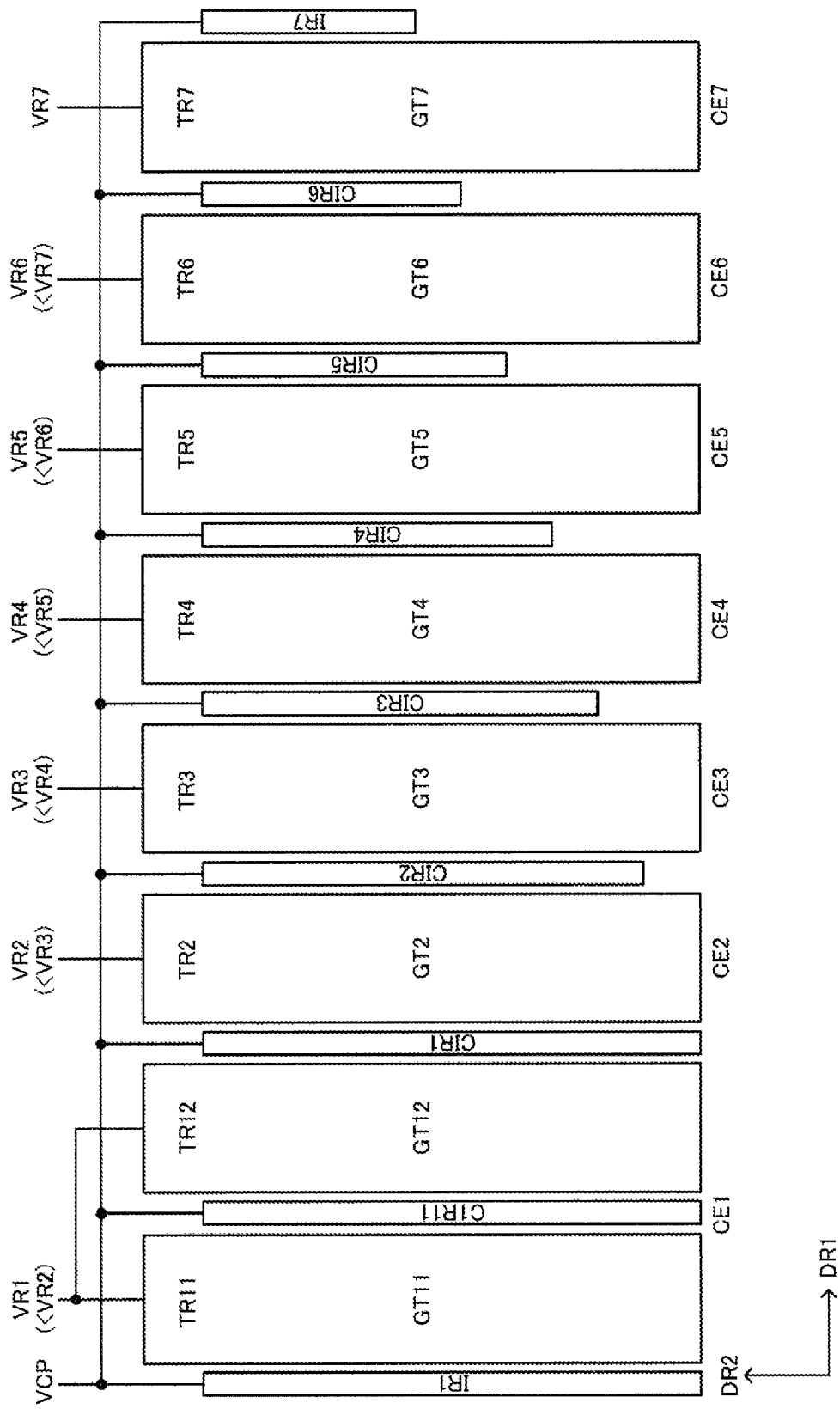
FIG. 15 shows a third arrangement configuration example of the variable capacitance circuit provided with a plurality of transistors having different channel widths.

FIG. 15 shows a third arrangement configuration example of the variable capacitance circuit 36 provided with a plurality of transistors TR1 to TR7 having different channel widths. FIG. 15 differs from FIG. 14 in that, in FIG. 14, the variable capacitance element CE1 is constituted by one transistor TR1, whereas in FIG. 15, the variable capacitance element CE1 is constituted by two transistors TR11 and TR12. The same reference voltage VR1 is supplied to the gates GT11 and GT12 of the two transistors TR11 and TR12 constituting the variable capacitance element CE1. In this way, in FIG. 15, the capacity CP1 of the variable capacitance element CE1 can be increased as compared with FIG. 14 while supplying the same reference voltage VR1 to the gates GT1 and GT2. Thereby, the further improvement of the linearity characteristics of the total capacity of the variable capacitance circuit 36 can be realized.

Figure 16:
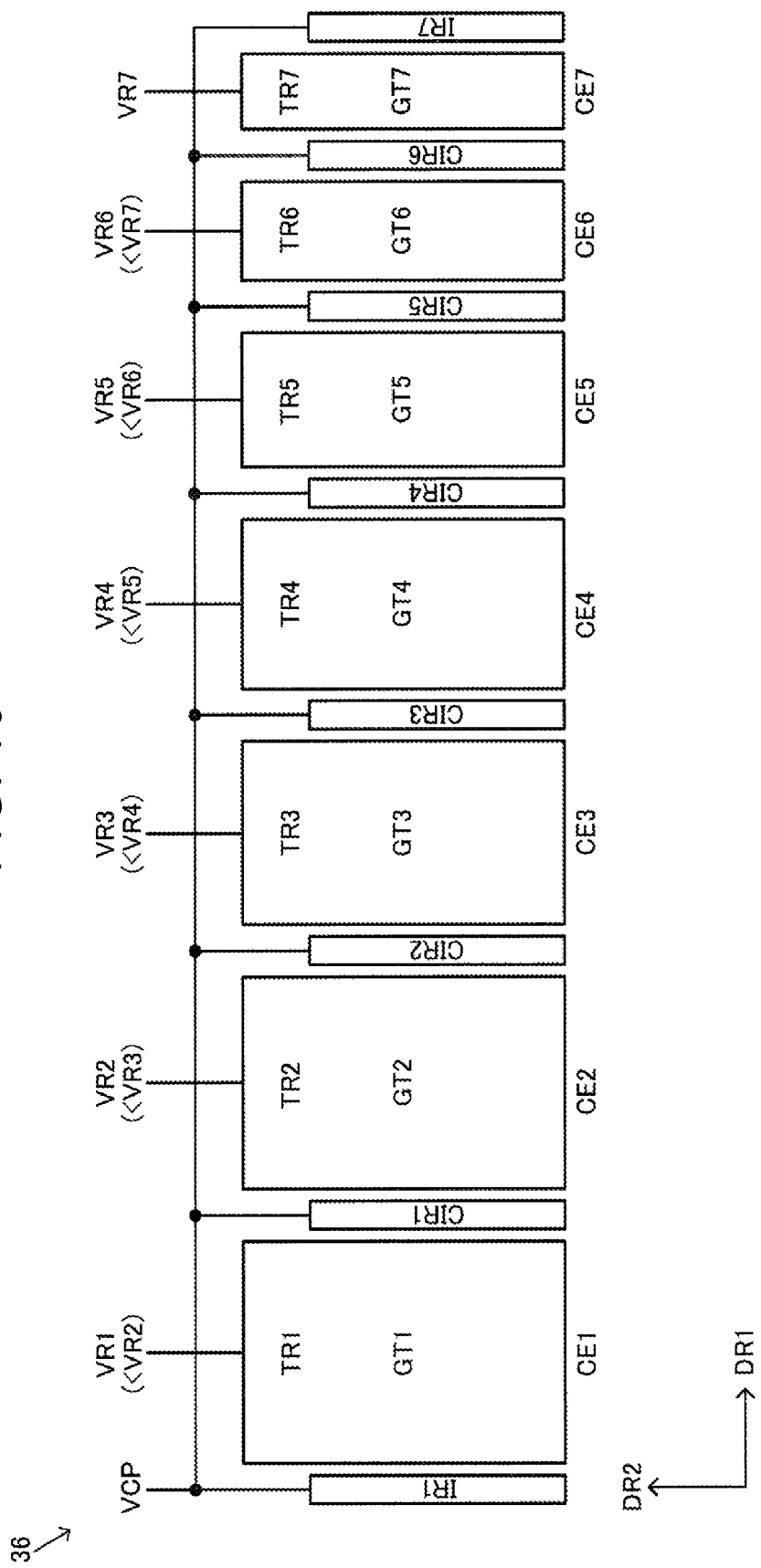
FIG. 16 shows an arrangement configuration example of the variable capacitance circuit provided with a plurality of transistors having different channel lengths.

FIG. 16 shows an arrangement configuration example of the variable capacitance circuit 36 provided with a plurality of transistors TR1 to TR7 having different channel lengths. In FIG. 12, the channel lengths correspond to the lengths in the direction DR1 for the channel regions of the transistors TR1 to TR7.

For example, in FIG. 16, the relationship of LE1>LE2>LE3>LE4>LE5>LE6>LE7 is established for the channel lengths LE1 to LE7 of the transistors TR1 to TR7. Therefore, similar to FIGS. 12, 14, and 15, the relationship of CP1>CP2>CP3>CP4>CP5>CP6>CP7 is established for the capacities of the variable capacitance elements CE1 to CE7. Further, similar to FIGS. 12, 14, and 15, the relationship of VR1<VR2<VR3<VR4<VR5<VR6<VR7 is also established for the reference voltages supplied to the gates GT1 to GT7 of the variable capacitance elements CE1 to CE7. As described above, the capacities of the variable capacitance elements CE1 to CE7 may be set according to the channel widths of the transistors TR1 to TR7 or may be set according to the channel lengths of the transistors TR1 to TR7.

Figure 17:
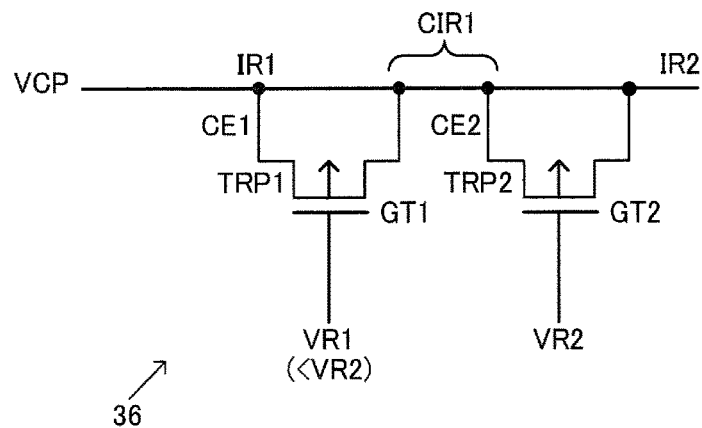
FIG. 17 shows a configuration example of the variable capacitance circuit using a P-type transistor.
Figure 18:
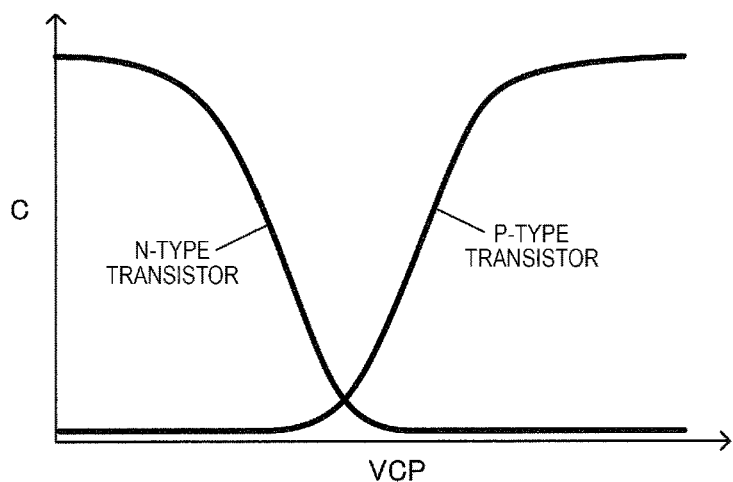
FIG. 18 shows an example of voltage capacitance characteristics of the P-type transistor and an N-type transistor.

Although the case where the transistor constituting the variable capacitance element is the N-type transistor has been described above, the transistor constituting the variable capacitance element may be the P-type transistor. For example, in FIG. 17, the variable capacitance elements CE1 and CE2 are constituted by the P-type transistors TRP1 and TRP2, respectively. The reference voltages VR1 and VR2 are supplied to the gates GT1 and GT2 of the P-type transistors TRP1 and TRP2, and the capacitance control voltage VCP is supplied to the impurity regions IR1 and IR2 and the common impurity region CIR1. As shown in FIG. 18, the voltage capacitance characteristics of the N-type transistor and the voltage capacitance characteristics of the P-type transistor are different from each other. For example, in the case of the N-type transistor, the capacity of the MOS capacitor increases when the capacitance control voltage VCP supplied to the source region and the drain region decreases, but in the case of the P-type transistor, the capacity of the MOS capacitor increases when the capacitance control voltage VCP increases. For example, as shown in FIG. 17, when the transistors constituting the variable capacitance elements CE1 and CE2 are P-type transistors TRP1 and TRP2, the reference voltage VR1 is made smaller than the reference voltage VR2 so that it is set to VR1<VR2. At this time, for the capacities CP1 and CP2 of the variable capacitance elements CE1 and CE2, the capacity CP1 is made smaller than the capacity CP2 so that it is set to CP1<CP2. For example, taking the arrangement configuration of FIGS. 12 and 14 to 16 as an example, the relationship of VR1<VR2<VR3<VR4<VR5<VR6<VR7 is established for the reference voltages VR1 to VR7. For the capacities CP1 to CP7 of the variable capacitance elements CE1 to CE7, the relationship of CP1<CP2<CP3<CP4<CP5<CP6<CP7 is established. In this way, as shown in FIG. 19, the linearity characteristics of the total capacity CTOT of the variable capacitance circuit 36 is improved, and the linearity of the capacitance change can be secured in a wide voltage range.

Figure 19:
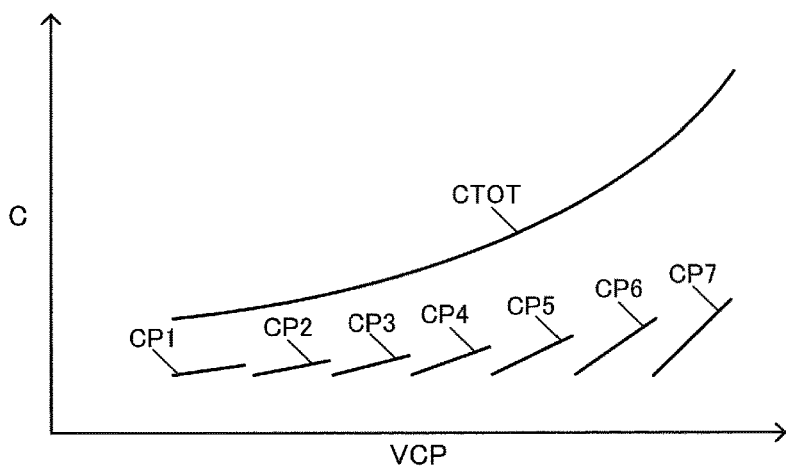
FIG. 19 shows an example of voltage capacitance characteristics of the variable capacitance circuit when the P-type transistor is used.

For example, in FIG. 19, the slope of the voltage capacitance characteristic of the capacity CP7 is the largest, and the slope of the voltage capacitance characteristic of the capacitor CP1 is the smallest. That is, the sensitivity for the variable capacitance element CE7 is the highest, and the sensitivity for the variable capacitance element CE1 is the lowest. By adjusting the slopes of the voltage capacitance characteristics of the capacitors CP7 to CP1 in this way, the linearity of the total capacity CTOT is ensured. Such adjustment of the slopes of the voltage capacitance characteristics can be realized by adjusting the transistor sizes by adjusting the channel widths or channel lengths of the transistors TRP1 to TRP7 constituting the variable capacitance elements CE1 to CE7. That is, by adjusting the transistor sizes of the transistors TRP1 to TRP7 so that CP1<CP2<CP3<CP4<CP5<CP6<CP7 is established, the sensitivity adjustment, which is a slope adjustment for CP1 to CP7, is performed to ensure the linearity of the total capacity CTOT as shown in FIG. 19.

3. Oscillation Circuit

Figure 20:
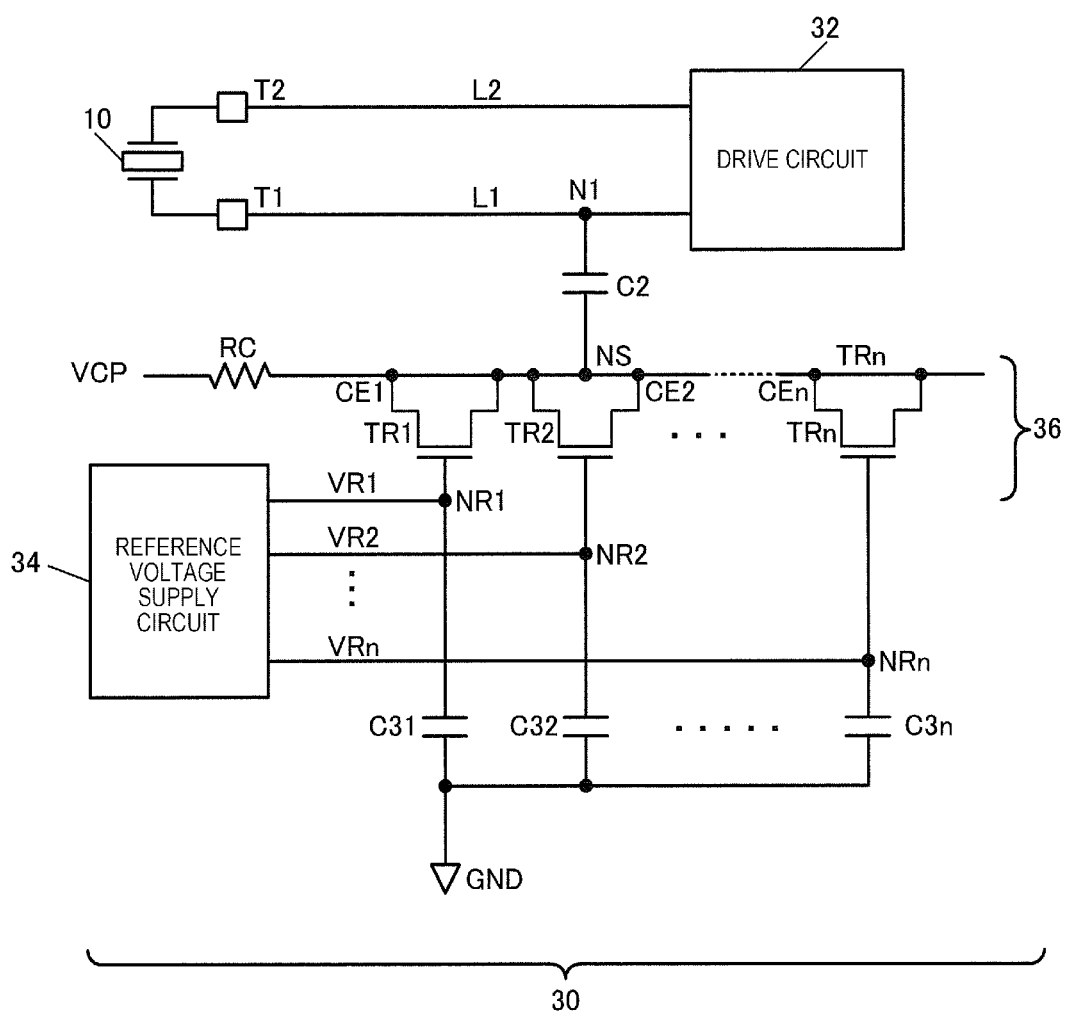
FIG. 20 shows a configuration example of an oscillation circuit.

FIG. 20 shows a configuration example of the oscillation circuit 30. The oscillation circuit 30 in FIG. 20 includes a drive circuit 32, a variable capacitance circuit 36, a reference voltage supply circuit 34, and a capacitor C2. In FIG. 20, the variable capacitance circuit 36 is electrically coupled to the wiring L1 that couples one end of the vibrator 10 and the oscillation circuit 30 with each other, via a DC cut capacitor C2. The wiring L1 is a first wiring. The wiring L1 may be a wiring on an input node side or a wiring on an output node side of the drive circuit 32.

For example, in FIG. 20, the variable capacitance circuit 36 includes n variable capacitance elements CE1 to CEn, and the variable capacitance elements CE1 to CEn are constituted by transistors TR1 to TRn. "n" is an integer of two or more. Reference voltages VR1 to VRn are supplied to gates of the transistors TR1 to TRn. These reference voltages VR1 to VRn are supplied by the reference voltage supply circuit 34. The capacitors C31 to C3n are provided between supply nodes NR1 to NRn of the reference voltages VR1 to VRn and the GND node. That is, the capacitors C31 to C3n are provided between the gate nodes of the transistors TR1 to TRn and the GND node. The capacitance control voltage VCP is supplied to the impurity regions and the common impurity regions which are the source regions or the drain regions of the transistors TR1 to TRn. For example, the control circuit 50 in FIGS. 1 and 2 supplies the capacitance control voltage VCP to the supply node NS of the capacitance control voltage VCP in the variable capacitance circuit 36 via the resistor RC. The supply node NS is coupled to the impurity regions and the common impurity regions of the transistors TR1 to TRn. The capacitor C2 is provided between the wiring L1 and the supply node NS. That is, one end of the capacitor C2 is coupled to the node N1 which is a coupling node with the wiring L1, and the other end of the capacitor C2 is coupled to the supply node NS of the capacitance control voltage VCP. The capacitor C2 is a DC cut capacitor, and the capacity of the capacitor C2 is sufficiently larger as compared with the capacity of the variable capacitance circuit 36. By coupling the variable capacitance circuit 36 to the wiring L1 via the DC cut capacitor C2, the load capacitance of the oscillation circuit 30 can be appropriately adjusted using the variable capacitance circuit 36. The reference voltages VR1 to VR7 can be supplied to the gates of the transistors TR1 to TR7 of the variable capacitance circuit 36 while supplying the capacitance control voltage VCP to the supply node NS to which the impurity region or the common impurity region of the variable capacitance circuit 36 are coupled. Accordingly, it is possible to ensure the linearity of the capacitance change while suppressing an increase in the load capacitance or increase in the circuit size of the variable capacitance circuit 36.

Figure 21:
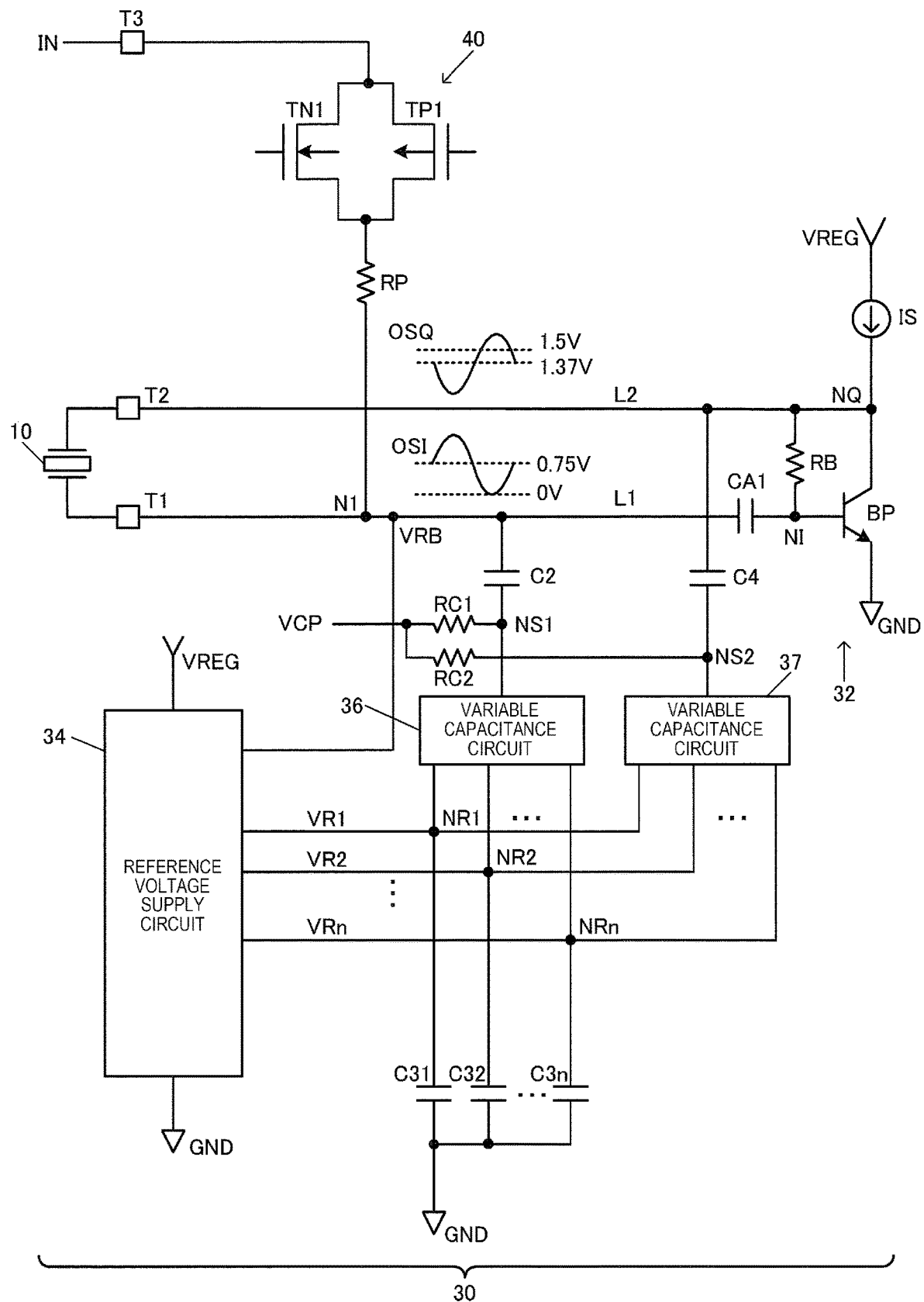
FIG. 21 shows a detailed first configuration example of the oscillation circuit.

FIG. 21 shows a detailed first configuration example of the oscillation circuit 30. The oscillation circuit 30 in FIG. 21 includes a drive circuit 32, a DC cut capacitor CA1, a reference voltage supply circuit 34, a DC cut capacitor C2, and a variable capacitance circuit 36. The capacitor CA1 is a first capacitor, and the capacitor C2 is a second capacitor. The oscillation circuit 30 can include a DC cut capacitor C4 and a variable capacitance circuit 37. The configuration of the variable capacitance circuit 37 is a circuit having the same configuration as that of the variable capacitance circuit 36, and a detailed description thereof will be omitted. Note that the capacitor C4 and the variable capacitance circuit 37 are not indispensable components. A modification can be possible without providing the capacitor C4 and the variable capacitance circuit 37. Capacitors C31 to C3n are provided between the variable capacitance circuit 36 and the variable capacitance circuit 37, and the GND node.

The drive circuit 32 is a circuit that drives the vibrator 10 to oscillate. In FIG. 21, the drive circuit 32 includes a current source IS, a bipolar transistor BP, and a resistor RB. The current source IS is provided between the power supply node of VREG and the bipolar transistor BP, and supplies a constant current to the bipolar transistor BP. The bipolar transistor BP is a transistor that drives the vibrator 10. A base node is an input node NI of the drive circuit 32, and a collector node is an output node NQ of the drive circuit 32. The resistor RB is provided between the collector node and the base node of the bipolar transistor BP.

Figure 22:
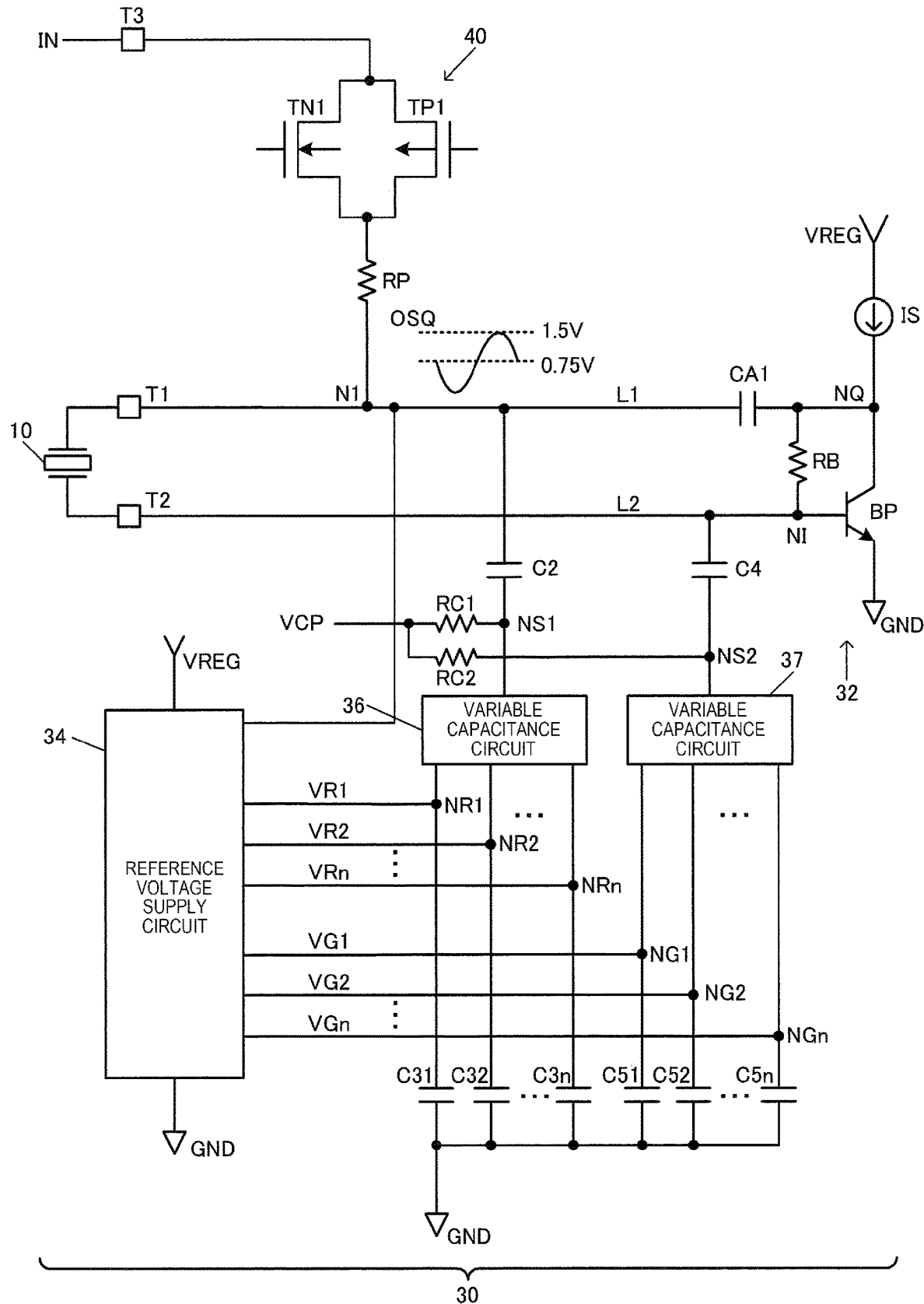
FIG. 22 shows a detailed second configuration example of the oscillation circuit.

The DC cut capacitor CA1 is provided between an input node NI of the drive circuit 32 and the wiring L1. For example, the capacitor CA1 has one end coupled to the input node NI of the drive circuit 32 and the other end coupled to the wiring L1. The wiring L1 is first wiring coupled to the terminal T1. By providing such a capacitor CA1, the DC component of the oscillation signal OSI is cut, and only the AC component is transmitted to the input node NI of the drive circuit 32, so that the bipolar transistor BP can be properly operated. Note that, as shown in FIG. 22 to be described later, the DC cut capacitor CA1 may be provided between an output node NQ of the drive circuit 32 and the wiring L1.

The reference voltage supply circuit 34 supplies the reference voltages VR1 to VRn to the variable capacitance circuit 36 and the variable capacitance circuit 37. The reference voltage supply circuit 34 includes a plurality of resistors provided in series between the VREG node and the GND node, and outputs voltages obtained by dividing the VREG voltage as reference voltages VR1 to VRn. In this case, resistors are provided between a coupling node between the resistors of the plurality of resistors, and output nodes of the reference voltages VR1 to VRn. Thereby, the reference voltages VR1 to VRn can be supplied with resistance separation.

The reference voltage supply circuit 34 supplies a bias voltage setting reference voltage VRB to the wiring L1. That is, the reference voltage VRB is supplied to the wiring L1 that couples the terminal T1 and the oscillation circuit 30 with each other. The reference voltage supply circuit 34 supplies the reference voltage of, for example, VRB=0.75 V to the wiring L1, so that an amplitude center voltage of the oscillation signal OSI in the wiring L1 can be set to 0.75 V. The amplitude center voltage 1.37 V of the oscillation signal OSQ in the wiring L2 is set based on, for example, a base-emitter voltage VBE of the bipolar transistor BP and a base current IB flowing through the resistor RB. For example, the amplitude center voltage of the oscillation signal OSQ is set to a voltage of VBE+IB×RB.

A DC cut capacitor C2 has one end electrically coupled to the wiring L1 and the other end electrically coupled to the supply node NS1 of the capacitance control voltage VCP. The capacitance control voltage VCP is supplied to the supply node NS2 via the resistor RC2. The capacitance control voltage VCP is variably controlled in a voltage range of 0.2 V to 1.3 V, for example. One end of the variable capacitance circuit 36 is electrically coupled to the supply node NS1, and the capacitance control voltage VCP is supplied. Taking FIG. 3 and FIG. 6 as an example, the supply node NS1 is electrically coupled to the impurity regions IR1, IR2, and common impurity region CIR1, and the capacitance control voltage VCP is supplied to these regions. Taking FIGS. 12 and 14 to 16 as an example, the supply node NS1 is electrically coupled to the impurity regions IR1, IR7, and common impurity regions CIR1 to CIR6, and the capacitance control voltage VCP is supplied to these regions. The reference voltage supply circuit 34 supplies the reference voltages VR1 to VRn to the supply nodes NR1 to NRn at the other end of the variable capacitance circuit 36. The capacitors C31 to C3n are provided between supply nodes NR1 to NRn of the reference voltages VR1 to VRn and the GND node. Taking FIG. 3 and FIG. 6 as an example, the supply nodes NR1 and NR2 are electrically coupled to the gates GT1 and GT2, and the reference voltages VR1 and VR2 are supplied to the gates GT1 and GT2. Taking FIGS. 12 and 14 to 16 as an example, the supply nodes NR1 to NR7 are electrically coupled to the gates GT1 to GT7, and the reference voltages VR1 to VR7 are supplied to the gates GT1 to GT7.

A DC cut capacitor C4 has one end electrically coupled to the wiring L2 and the other end electrically coupled to the supply node NS2 of the capacitance control voltage VCP. The capacitance control voltage VCP is supplied to the supply node NS1 via the resistor RC1. One end of the variable capacitance circuit 37 is electrically coupled to the supply node NS2, and the capacitance control voltage VCP is supplied. The reference voltage supply circuit 34 supplies the reference voltages VR1 to VRn to the supply nodes NR1 to NRn at the other end of the variable capacitance circuit 37.

In FIG. 21, the switch circuit 40 is provided between the terminal T3 and the wiring L1. A resistor RP is provided between the switch circuit 40 and the node N1 of the wiring L1. The switch circuit 40 can be realized by, for example, a transfer gate or the like constituted by a P-type transistor TP1 and an N-type transistor TN1. In the test mode, the switch circuit 40 is turned on, and a test external input signal IN input via the terminal T3 is input to one end of the vibrator 10 via the switch circuit 40, the wiring L1, and the terminal T1. Thereby, it is possible to perform tests and inspections such as overdrive or DLD.

When the switch circuit 40 is provided for the test mode, a leakage current is generated in the N-type transistor TN1 of the switch circuit 40, and this leakage current may cause a problem that the oscillation frequency becomes unstable. For example, when an oscillation amplitude of the oscillation signal OSI in the wiring L1 swings greatly to the negative voltage side, the N-type transistor TN1 of the switch circuit 40 becomes a weakly turned-on state, and the leakage current flows to the terminal T3 side.

On the other hand, the external input signal IN such as a frequency control signal, an output enable signal, or a standby signal is input to the terminal T3 in the normal operation mode, and the voltage level of the external input signal IN changes variously. Therefore, when the voltage level of the external input signal IN changes, the magnitude of the leakage current flowing through the N-type transistor TN1 also changes, and the oscillation frequency of the oscillation circuit 30 becomes unstable.

In this regard, in the configuration example in FIG. 21, a DC cut capacitor CA1 is provided between the wiring L1 coupled to the terminal T1 of the vibrator 10 and the input node NI of the drive circuit 32 of the oscillation circuit 30. By providing such a DC cut capacitor CA1, the reference voltage VRB having any voltage level can be supplied to the wiring L1. Note that the DC voltage level of the input node NI is set to the base-emitter voltage VBE of the bipolar transistor BP.

The reference voltage supply circuit 34 supplies the reference voltage VRB that prevents the voltage level of the oscillation signal OSI from greatly swinging to the negative voltage side to the wiring L1. For example, a reference voltage VRB having a voltage level that does not cause a leakage current due to a forward bias of the PN junction of the transistor TN1 is supplied to the wiring L1. In FIG. 21, the reference voltage supply circuit 34 supplies the reference voltage VRB=0.75 V to the wiring L1. Thereby, the voltage level of the oscillation signal OSI does not greatly swing to the negative voltage side, and in the N-type transistor TN1 of the switch circuit 40, a leakage current caused by a negative voltage is prevented from occurring. A DC cut capacitor C2 is provided between the wiring L1 and the supply node NS1 of the capacitance control voltage VCP so that the reference voltage VRB supplied to the wiring L1 does not affect the capacity of the variable capacitance circuit 36. In this way, even when the voltage level of the reference voltage VRB which is supplied to the wiring L1 is set to a relatively high voltage level such as 0.75 V, it is possible to prevent the capacity of the variable capacitance circuit 36 from being affected. The same applies to the variable capacitance circuit 37. For the amplitude center voltage of the oscillation signal OSQ in the wiring L2 is set based on, for example, a base-emitter voltage VBE of the bipolar transistor BP and a base current IB flowing through the resistor RB. For example, the amplitude center voltage of the oscillation signal OSQ is set to a voltage level of VBE+IB×RB, and is set to 1.37 V, for example, in FIG. 21.

FIG. 22 shows a detailed second configuration example of the oscillation circuit 30. In FIG. 21, the DC cut capacitor CA1 is provided between the input node NI of the drive circuit 32 of the oscillation circuit 30 and the wiring L1, but in FIG. 22, the DC cut capacitor CA1 is provided between the output node NQ of the drive circuit 32 and the wiring L1. In other words, in FIG. 21, the terminal T1 is a terminal on the input node NI side of the drive circuit 32, but in FIG. 22, the terminal T1 is a terminal on the output node NQ side of the drive circuit 32. Further, one end of the switch circuit 40 is coupled to the wiring L1, and the reference voltage supply circuit 34 supplies the reference voltage VRB=0.75 V to the wiring L1. For example, the substrate of the P-type transistor TP1 of the switch circuit 40 is set to the regulated voltage VREG=1.5 V in the normal operation mode. As described above, when the substrate of the transistor TP1 is set to the regulated voltage VREG=1.5 V, if the amplitude voltage of the oscillation signal OSQ greatly exceeds 1.5 V, a leakage current may occur in the transistor TP1. In this regard, in FIG. 22, when the reference voltage supply circuit 34 supplies the reference voltage VRB=0.75 V to the wiring L1, the amplitude center voltage of the oscillation signal OSQ is set to 0.75 V, and the operation is performed so that the amplitude voltage of the oscillation signal OSQ does not greatly exceed 1.5 V. Thereby, the leakage current is prevented from occurring in the transistor TP1, and a situation in which the oscillation frequency fluctuates due to the leakage current can be prevented.

In FIG. 21, the reference voltage supply circuit 34 supplies the common reference voltages VR1 to VRn to the variable capacitance circuit 36 and the variable capacitance circuit 37, but in FIG. 22, the reference voltage supply circuit 34 supplies the reference voltages VR1 to VRn to the variable capacitance circuit 36 and supplies the reference voltages VG1 to VGn to the variable capacitance circuit 37. The reference voltages VR1 to VRn and the reference voltages VG1 to VGn are, for example, reference voltages having the same voltage level. Note that both the voltage levels may be different.

The reference voltage supply circuit 34 includes a plurality of resistors provided in series between the VREG node and the GND node, and outputs voltages obtained by dividing the VREG voltage as reference voltages VR1 to VRn and VG1 to VGn. In this case, resistors are provided between coupling nodes between the resistors of the plurality of resistors, and output nodes of the reference voltages VR1 to VRn. Further, resistors are also provided between coupling nodes between the resistors of the plurality of resistors, and output nodes of the reference voltages VG1 to VGn. Thereby, the reference voltages VR1 to VRn and the reference voltages VG1 to VGn can be supplied with resistance separation.

One end of the variable capacitance circuit 37 is electrically coupled to the supply node NS2, and the capacitance control voltage VCP is supplied. The reference voltage supply circuit 34 supplies the reference voltages VG1 to VGn to the supply nodes NG1 to NGn at the other end of the variable capacitance circuit 37. The capacitors C51 to C5$n$ are provided between supply nodes NG1 to NGn of the reference voltages VG1 to VGn and the GND node.

4. Oscillator

Figure 23:
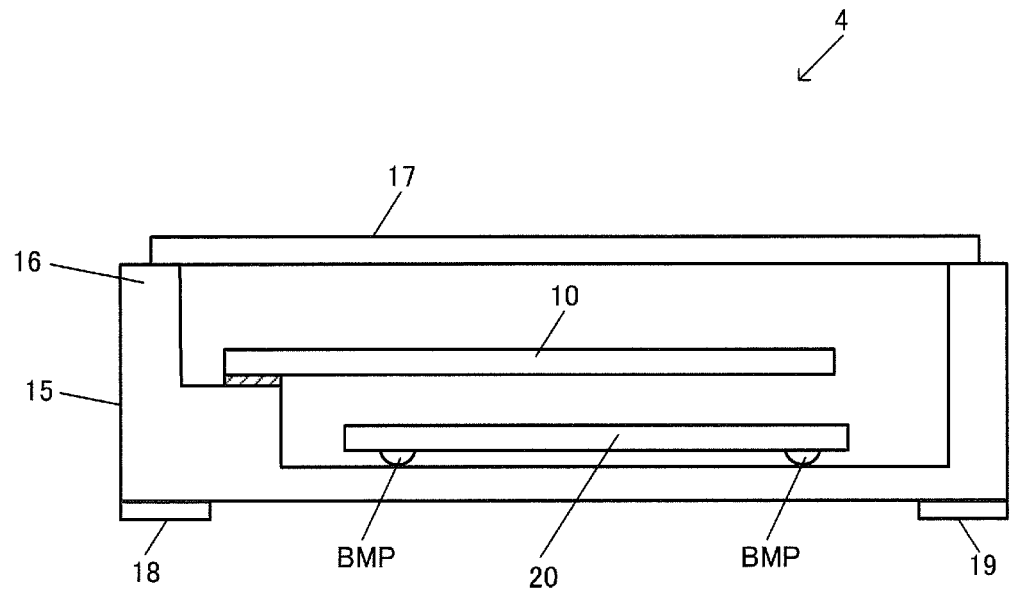
FIG. 23 shows a first structural example of the oscillator.

Next, a structural example of the oscillator 4 of the present embodiment will be described. FIG. 23 shows a first structural example of the oscillator 4. The oscillator 4 has the vibrator 10, the circuit device 20, and the package 15 that accommodates the vibrator 10 and the circuit device 20. The package 15 is made of, for example, ceramic or the like, and has an accommodation space inside thereof, and the vibrator 10 and the circuit device 20 are accommodated in the accommodation space. The accommodation space is hermetically sealed and is preferably in a reduced pressure state that is close to a vacuum state. With the package 15, the vibrator 10 and the circuit device 20 can be suitably protected from impact, dust, heat, moisture, and the like.

The package 15 has a base 16 and a lid 17. Specifically, the package 15 includes a base 16 that supports the vibrator 10 and the circuit device 20, and a lid 17 that is bonded to the upper surface of the base 16 so as to form an accommodation space with the base 16. And the vibrator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via the conductive bumps BMP. The conductive bump BMP is, for example, a metal bump, and the vibrator 10 and the circuit device 20 are electrically coupled to each other via the bump BMP, the internal wiring of the package 15, the terminal electrode, or the like. The circuit device 20 is electrically coupled to the external terminals 18 and 19 of the oscillator 4 via the bumps BMP or the internal wiring of the package 15. The external terminals 18 and 19 are formed on the outer bottom surface of the package 15. The external terminals 18 and 19 are coupled to an external device via the external wirings. The external wiring is, for example, wiring or the like formed on a circuit substrate on which an external device is mounted. Thereby, a clock signal or the like can be output to the external device.

In FIG. 23, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the vibrator 10.

Figure 24:
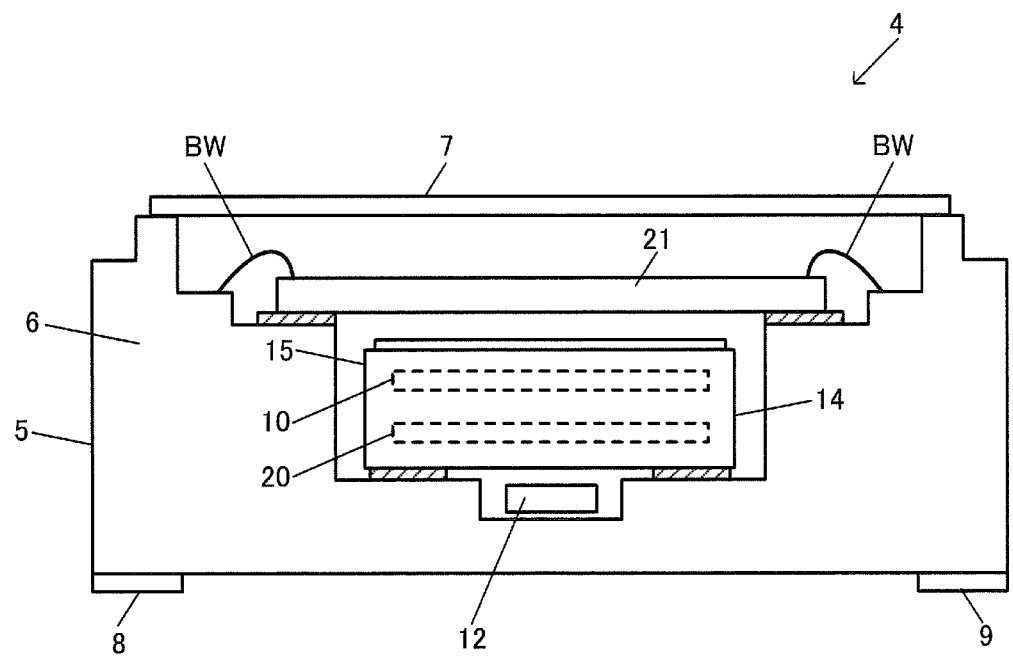
FIG. 24 shows a second structural example of the oscillator.

FIG. 24 shows a second structural example of the oscillator 4. The oscillator 4 in FIG. 24 includes a vibrator 10, a circuit device 20, and a circuit device 21. The oscillator 4 also includes the package 15 accommodating the vibrator 10 and the circuit device 20, and a package 5 accommodating the package 15 and the circuit device 21. The package 15 and the package 5 are a first package and a second package, respectively. The first package and the second package can also be referred to as a first container and a second container.

In the present embodiment, the circuit device 20 accommodated in the package 15 performs the first temperature compensation processing, and the circuit device 21 accommodated in the package 5 performs the second temperature compensation processing. For example, the vibrator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 21 that performs digital-mode second temperature compensation processing are accommodated in the package 5, so that the oscillator 4 that generates highly accurate clock signal is configured. The circuit device 21 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the vibrator 10 and the circuit device 20 are accommodated in the package 15, and the circuit device 21 are accommodated. The accommodation space is hermetically sealed and is preferably in a reduced pressure state that is close to a vacuum state. With the package 5, the circuit device 21 and the oscillator 14 can be suitably protected from impact, dust, heat, moisture, and the like.

The package 5 has a base 6 and a lid 7. Specifically, the package 5 includes a base 6 that supports the oscillator 14 and the circuit device 21, and a lid 7 that is bonded to the upper surface of the base 6 so as to form an accommodation space with the base 6. The base 6 has a first recess portion opening on the upper surface and a second recess portion opening on the bottom surface of the first recess portion. The circuit device 21 is supported on the bottom surface of the first recess portion. For example, the circuit device 21 is supported by a step portion on the bottom surface via a terminal electrode. The oscillator 14 is supported on the bottom surface of the second recess portion. For example, the oscillator 14 is supported by the step portion on the bottom surface via the terminal electrode. Further, the base 6 has a third recess portion opening in the bottom surface of the second recess portion, and the circuit component 12 is disposed in the third recess portion. For example, a capacitor or a temperature sensor can be assumed as the circuit component 12 to be disposed.

The circuit device 21 is electrically coupled to a terminal of the oscillator 14 via, for example, a bonding wire BW, a terminal electrode formed in a step portion, or internal wiring of the package 5. Thereby, the clock signal or the temperature detection signal from the oscillator 14 can be input to the circuit device 21. Further, the circuit device 21 is electrically coupled to an external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, wiring or the like formed on a circuit substrate on which an external device is mounted. Thereby, a clock signal or the like can be output to the external device. Note that the terminal of the oscillator 14 and the external terminals 8 and 9 may be electrically coupled with each other.

In FIG. 24, the circuit device 21 is disposed in the upward direction of the oscillator 14, but the circuit device 21 may be disposed in the downward direction of the oscillator 14. The upward direction is a direction from the bottom surface of the package 5 toward the lid 7, and the downward direction is the opposite direction. The circuit device 21 may be provided on the side of the oscillator 14. That is, the oscillator 14 and the circuit device 21 are arranged side by side so as to be aligned in an upper surface view of the oscillator 4.

Next, the circuit device 21 will be described. The circuit device 21 includes a clock signal generation circuit to which a first clock signal that is a clock signal generated by the oscillator 14 is input as a reference clock signal. The clock signal generated by the clock signal generation circuit is output to the outside as an output clock signal of the oscillator 4. For example, the clock signal generation circuit of the circuit device 21 is constituted by a fractional N-type PLL circuit to which the first clock signal from the oscillator 14 is input as a reference clock signal. The PLL circuit performs a phase comparison of a reference clock signal that is a first clock signal and a feedback clock signal obtained by dividing the output clock signal of the PLL circuit by a frequency dividing circuit. A fractional N-type PLL circuit is realized by setting a fractional division ratio using a delta sigma modulator. Further, the control circuit included in the circuit device 21 performs correction processing of the division ratio data set in the PLL circuit based on the temperature compensation data, thereby the second temperature compensation processing is realized. The first temperature compensation processing performed in the oscillator 14 is realized by, for example, polynomial approximation temperature compensation processing performed by the control circuit 50 in FIGS. 1 and 2. The clock signal generation circuit may be constituted by a direct digital synthesizer. In this case, the second temperature compensation processing is realized by inputting the frequency control data corrected by the temperature compensation data with respect to the direct digital synthesizer that operates using the first clock signal as a reference clock signal.

According to the oscillator 4 in FIG. 24, the circuit device 20 that oscillates the vibrator 10 performs the first temperature compensation processing, thereby the amount of the frequency fluctuation in the frequency-temperature characteristics of the first clock signal which is output from the circuit device 20 that is a first circuit device, can be reduced. Further, the circuit device 21 that is the second circuit device performs the second temperature compensation processing when the clock signal is generated based on the first clock signal from the circuit device 20. As described above, the second temperature compensation processing is performed by the circuit device 21 after the first temperature compensation processing is performed by the circuit device 20, thereby it becomes possible to reduce or the like the micro-jump of frequency caused by variation of the temperature measurement result or the like, and possible to realize the clock frequency of the oscillator 4 with high accuracy or the like. In the oscillator 4 in FIG. 24, the first temperature compensation processing may be performed using a temperature sensor provided in the circuit device 20, and a temperature detection signal of this temperature sensor may be output from the circuit device 20 and input to the circuit device 21. The circuit device 21 may perform the second temperature compensation processing based on the input temperature detection signal. As described above, the first temperature compensation processing in the circuit device 20 and the second temperature compensation processing in the circuit device 21 can be performed based on the temperature detection signal from the same temperature sensor so that more appropriate temperature compensation processing can be realized. In this case, a distance between the temperature sensor built in the circuit device 20 and the vibrator 10 is shorter than a distance between the temperature sensor and the circuit device 21. Accordingly, by performing the digital temperature compensation processing, the distance between the circuit device 21 that generates a large amount of heat and the vibrator 10 can be increased, and the adversely effect of the heat generated by the circuit device 21 on the temperature detection result of the temperature sensor can be reduced. Therefore, the temperature of the vibrator 10 can be measured more accurately using the temperature sensor built in the circuit device 20.

5. Electronic Apparatus and Vehicle

Figure 25:
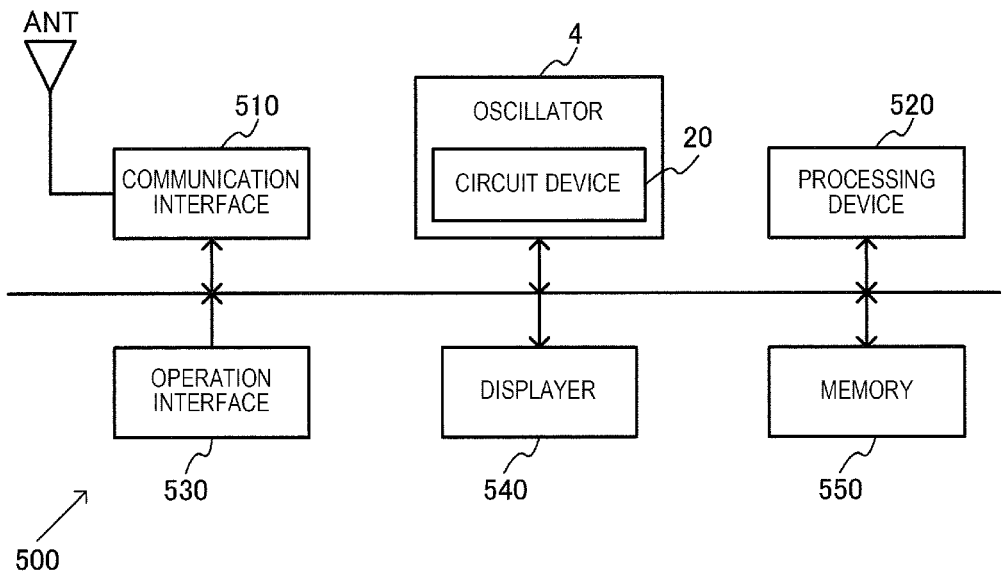
FIG. 25 shows a configuration example of an electronic apparatus.

FIG. 25 shows a configuration example of an electronic apparatus 500 including the circuit device 20 of the present embodiment. The electronic apparatus 500 includes the circuit device 20 of the present embodiment and a processing device 520 that operates by a clock signal based on the oscillation signal of the oscillation circuit 30 of the circuit device 20. Specifically, the electronic apparatus 500 includes the oscillator 4 having the circuit device 20 of the present embodiment, and the processing device 520 operates based on the clock signal from the oscillator 4. The electronic apparatus 500 can include an antenna ANT, a communication interface 510, an operation interface 530, a displayer 540, and a memory 550. The electronic apparatus 500 is not limited to the configuration shown in FIG. 25, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the circuit device 20 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the circuit device 20 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 26:
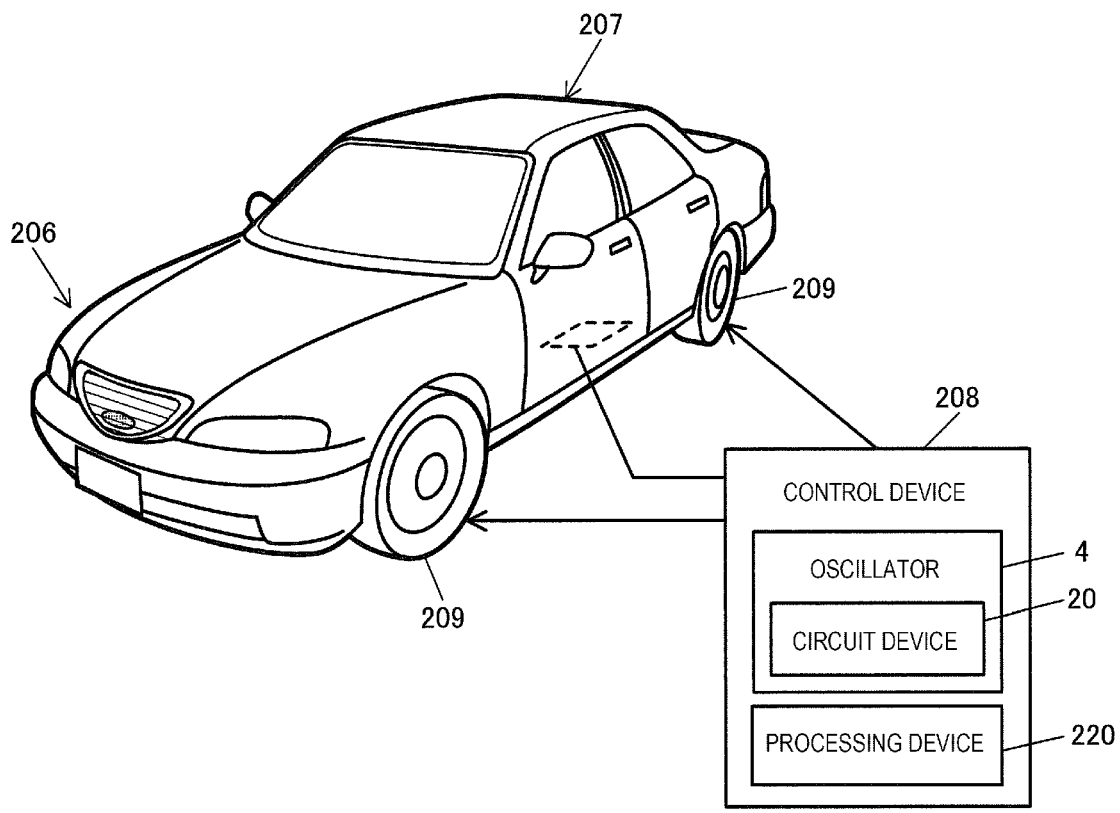
FIG. 26 shows a configuration example of a vehicle.

FIG. 26 shows an example of a vehicle including the circuit device 20 of the present embodiment. The vehicle includes the circuit device 20 of the present embodiment and a processing device 220 that operates by a clock signal based on an oscillation signal of the oscillation circuit 30 of the circuit device 20. Specifically, the vehicle includes the oscillator 4 having the circuit device 20 of the present embodiment, and the processing device 220 operates based on the clock signal from the oscillator 4. The circuit device 20 of the present embodiment can be incorporated into various moving objects such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 26 schematically shows an automobile 206 as a specific example of the vehicle.

The automobile 206 incorporates the circuit device 20 of the present embodiment. Specifically, the automobile 206 that is a vehicle includes a control device 208, and the control device 208 includes the oscillator 4 including the circuit device 20 of the present embodiment and a processing device 220 operating based on a clock signal generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as a meter panel apparatus and a navigation apparatus provided in a moving object such as the automobile 206.

As described above, the circuit device according to the present embodiment includes an oscillation circuit oscillating a vibrator, in which the oscillation circuit includes a variable capacitance circuit having a first variable capacitance element constituted by a first transistor and a second variable capacitance element constituted by a second transistor, and adjusting a load capacitance of the oscillation circuit, and a reference voltage supply circuit supplying a first reference voltage and a second reference voltage to the variable capacitance circuit. Further, the first reference voltage is supplied to a first gate that is a gate of the first transistor and a capacitance control voltage is supplied to a first impurity region that is one impurity region of the first transistor, the second reference voltage is supplied to a second gate that is a gate of the second transistor and the capacitance control voltage is supplied to a second impurity region that is one impurity region of the second transistor. Further, the capacitance control voltage is supplied to a first common impurity region which is a region formed of the other impurity regions of the first transistor and the second transistor.

According to the present embodiment, the load capacitance of the oscillation circuit is adjusted by the variable capacitance circuit including the first variable capacitance element and the second variable capacitance element. The first reference voltage and the capacitance control voltage are supplied to the first gate and the first impurity region of the first transistor constituting the first variable capacitance element, respectively. The second reference voltage and the capacitance control voltage are supplied to the second gate and the second impurity region of the second transistor constituting the second variable capacitance element, respectively. The capacitance control voltage is supplied to the first common impurity region of the first transistor and the second transistor. In this way, the variable capacitance circuit can be realized using the gate capacitances of the first transistor and the second transistor. By supplying the first reference voltage to the first gate of the first transistor and supplying the second reference voltage to the second gate of the second transistor, the linearity characteristics in the voltage capacitance characteristics of the variable capacitance circuit can be improved. Furthermore, by sharing the other impurity regions of the first transistor and the second transistor as the first common impurity region, it is possible to prevent unnecessary capacitance from being added to the load capacitance of the oscillation circuit, thereby the circuit can be reduced in size.

In the present embodiment, the first impurity region, the first gate, the common impurity region, the second gate, and the second impurity region may be provided along a first direction in the order of the first impurity region, the first gate, the common impurity region, the second gate, and the second impurity region.

In this way, the length of the variable capacitance circuit in the first direction can be shortened, and the variable capacitance circuit can be reduced in size.

In the present embodiment, the first transistor and the second transistor may be N-type transistors, and the first reference voltage may be smaller than the second reference voltage, and a capacity of the first variable capacitance element may be larger than a capacity of the second variable capacitance element.

In this way, the first reference voltage smaller than the second reference voltage is supplied to the first gate of the N-type first transistor constituting the first variable capacitance element having a larger capacity as compared with a capacity of the second capacitance element. Therefore, the linearity characteristics of the voltage capacitance characteristics of the variable capacitance circuit can be improved.

In the present embodiment, the first transistor and the second transistor may be P-type transistors, and the first reference voltage may be smaller than the second reference voltage, and a capacity of the first variable capacitance element may be smaller than a capacity of the second variable capacitance element.

In this way, the first reference voltage smaller than the second reference voltage is supplied to the first gate of the P-type first transistor constituting the first variable capacitance element having a smaller capacity as compared with a capacity of the second capacitance element. Therefore, the linearity characteristics of the voltage capacitance characteristics of the variable capacitance circuit can be improved.

In the present embodiment, the variable capacitance circuit may include a third variable capacitance element constituted by a third transistor. Further, the reference voltage supply circuit may supply a third reference voltage, the third reference voltage may be supplied to a third gate that is a gate of the third transistor and the capacitance control voltage may be supplied to a third impurity region that is one impurity region of the third transistor, and the capacitance control voltage may be supplied to a second common impurity region which is a region formed of the other impurity regions of the second transistor and the third transistor.

In this way, by sharing the other impurity regions of the second transistor and the third transistor as the second common impurity region, it is possible to prevent unnecessary capacitance from being added to the load capacitance of the oscillation circuit, thereby the circuit can be reduced in size.

In the present embodiment, the capacitance control voltage may be a voltage for a temperature compensation for an oscillation frequency of the oscillation circuit.

In this way, the temperature compensation for the oscillation frequency of the oscillation circuit can be realized by adjusting the load capacitance by the variable capacitance circuit.

In the present embodiment, the variable capacitance circuit may be electrically coupled to a first wiring coupling one end of the vibrator and the oscillation circuit with each other via a DC cut capacitor.

By coupling the variable capacitance circuit to the first wiring via the DC cut capacitor in this way, the load capacitance on the first wiring side of the oscillation circuit can be adjusted using the variable capacitance circuit.

In the present embodiment, the oscillation circuit may include a drive circuit that drives and oscillates the vibrator, a first capacitor for DC cut provided between an input node or an output node of the drive circuit and a first wiring that couples one end of the vibrator and the oscillation circuit with each other, and a second capacitor for DC cut of which one end is electrically coupled to the first wiring and the other end is electrically coupled to a supply node of the capacitance control voltage. Further, one end of the variable capacitance circuit may be electrically coupled to the supply node, and the capacitance control voltage may be supplied.

In this way, the DC component of the oscillation signal in the first wiring can be cut using the first capacitor and transmitted to the drive circuit of the oscillation circuit. Further, since the DC component is cut by the second capacitor, it is possible to prevent the capacity of the variable capacitance circuit from being affected by the voltage of the first wiring.

In the present embodiment, the reference voltage supply circuit may supply a bias voltage setting reference voltage to the first wiring.

In this way, the voltage of the first wiring can be set using the bias voltage setting reference voltage from the reference voltage supply circuit, and the amplitude center voltage of the oscillation signal in the first wiring is set to a desired voltage.

Further, the present embodiment relates to an oscillator including the circuit device described above and the vibrator.

Further, the present embodiment relates to an electronic apparatus including the circuit device described above and a processing device that operates according to a clock signal based on an oscillation signal of the oscillation circuit.

Further, the present embodiment relates to a vehicle including the circuit device described above and a processing device that operates according to a clock signal based on an oscillation signal of the oscillation circuit.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations/operations of the circuit device, the oscillator, the electronic apparatus, and the vehicle are not limited to those described in this embodiment, and various modifications can be made.

What is claimed is:

1. A circuit device comprising:
an oscillation circuit oscillating a vibrator, wherein
the oscillation circuit includes
a variable capacitance circuit having a first variable capacitance element constituted by a first transistor and a second variable capacitance element constituted by a second transistor, and adjusting a load capacitance of the oscillation circuit, and
a reference voltage supply circuit supplying a first reference voltage and a second reference voltage to the variable capacitance circuit,
the first reference voltage is supplied to a first gate that is a gate of the first transistor and a capacitance control voltage is supplied to a first impurity region that is one impurity region of the first transistor,
the second reference voltage is supplied to a second gate that is a gate of the second transistor and the capacitance control voltage is supplied to a second impurity region that is one impurity region of the second transistor, and
the capacitance control voltage is supplied to a first common impurity region which is a region formed of the other impurity regions of the first transistor and the second transistor.

2. The circuit device according to claim 1, wherein
the first impurity region, the first gate, the common impurity region, the second gate, and the second impurity region are provided along a first direction in the order of the first impurity region, the first gate, the common impurity region, the second gate, and the second impurity region.

3. The circuit device according to claim 1, wherein
the first transistor and the second transistor are N-type transistors, and
the first reference voltage is smaller than the second reference voltage, and a capacity of the first variable capacitance element is larger than a capacity of the second variable capacitance element.

4. The circuit device according to claim 1, wherein
the first transistor and the second transistor are P-type transistors, and
the first reference voltage is smaller than the second reference voltage, and a capacity of the first variable capacitance element is smaller than a capacity of the second variable capacitance element.

5. The circuit device according to claim 1, wherein
the variable capacitance circuit includes a third variable capacitance element constituted by a third transistor,
the reference voltage supply circuit supplies a third reference voltage,
the third reference voltage is supplied to a third gate that is a gate of the third transistor and the capacitance control voltage is supplied to a third impurity region that is one impurity region of the third transistor, and
the capacitance control voltage is supplied to a second common impurity region which is a region formed of the other impurity regions of the second transistor and the third transistor.

6. The circuit device according to claim 1, wherein
the capacitance control voltage is a voltage for a temperature compensation for an oscillation frequency of the oscillation circuit.

7. The circuit device according to claim 1, wherein
the variable capacitance circuit is electrically coupled to a first wiring coupling one end of the vibrator and the oscillation circuit with each other via a DC cut capacitor.

8. The circuit device according to claim 1, wherein
the oscillation circuit includes
a drive circuit that drives and oscillates the vibrator,
a first capacitor for DC cut provided between an input node or an output node of the drive circuit and a first wiring that couples one end of the vibrator and the oscillation circuit with each other, and
a second capacitor for DC cut of which one end is electrically coupled to the first wiring and the other end is electrically coupled to a supply node of the capacitance control voltage, and
one end of the variable capacitance circuit is electrically coupled to the supply node, and the capacitance control voltage is supplied.

9. The circuit device according to claim 8, wherein
the reference voltage supply circuit supplies a bias voltage setting reference voltage to the first wiring.

10. An oscillator comprising:
the circuit device according to claim 1; and
the vibrator.

11. An electronic apparatus comprising:
the circuit device according to claim 1; and
a processing device operating according to a clock signal based on an oscillation signal of the oscillation circuit.

12. A vehicle comprising:
the circuit device according to claim 1; and
a processing device operating according to a clock signal based on an oscillation signal of the oscillation circuit.

* * * * *